(12) United States Patent
Park

(10) Patent No.: US 10,734,371 B2
(45) Date of Patent: Aug. 4, 2020

(54) SEMICONDUCTOR DEVICE

(71) Applicant: SAMSUNG ELECTRONICS CO. LTD., Suwon-si, Gyeonggi-Do (KR)

(72) Inventor: Hyun Mog Park, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/515,291

(22) Filed: Jul. 18, 2019

(65) Prior Publication Data

US 2020/0144242 A1 May 7, 2020

(30) Foreign Application Priority Data

Nov. 6, 2018 (KR) .................. 10-2018-0135264

(51) Int. Cl.
*H01L 25/18* (2006.01)
*H01L 27/11556* (2017.01)
(Continued)

(52) U.S. Cl.
CPC .............. *H01L 25/18* (2013.01); *H01L 24/05* (2013.01); *H01L 24/08* (2013.01); *H01L 24/89* (2013.01);
(Continued)

(58) Field of Classification Search
CPC ... H01L 25/18; H01L 27/11526; H01L 24/05; H01L 27/11573; H01L 27/11556; H01L 24/08; H01L 25/50; H01L 27/11582; H01L 24/89; H01L 2224/0557; H01L 2224/32225; H01L 24/73; H01L 2221/68359; H01L 2225/06586;
(Continued)

(56) References Cited

U.S. PATENT DOCUMENTS 8,476,708 B2 7/2013 Fukuzumi et al.
9,012,292 B2 4/2015 Lee
(Continued)

FOREIGN PATENT DOCUMENTS

JP 2011-294829 10/2011
KR 10-2014-0028969 3/2014
KR 10-2016-0067844 6/2016

*Primary Examiner* — Victor A Mandala
(74) *Attorney, Agent, or Firm* — F. Chau & Associates, LLC

(57) ABSTRACT

A semiconductor device includes a first substrate structure having a first substrate, circuit elements disposed on the first substrate, and first bonding pads disposed on the circuit elements. A second substrate structure is connected to the first substrate structure. The second substrate structure includes a second substrate having first and second surfaces, first and second conductive layers spaced apart from each other, a pad insulating layer having an opening exposing a portion of the second conductive layer and gate electrodes stacked to be spaced apart from each other in a first direction and electrically connected to the circuit elements. First contact plugs extend on the second surface in the first direction and connect to the gate electrodes. A second contact plug extends on the second surface in the first direction and electrically connects to the second conductive layer. Second bonding pads electrically connect to the first and second contact plugs.

20 Claims, 20 Drawing Sheets

(51) Int. Cl.
*H01L 25/00* (2006.01)
*H01L 27/11526* (2017.01)
*H01L 27/11573* (2017.01)
*H01L 27/11582* (2017.01)
*H01L 23/00* (2006.01)
H01L 25/065 (2006.01)
H01L 21/683 (2006.01)

(52) U.S. Cl.
CPC ........ *H01L 25/50* (2013.01); *H01L 27/11526* (2013.01); *H01L 27/11556* (2013.01); *H01L 27/11573* (2013.01); *H01L 27/11582* (2013.01); H01L 21/6835 (2013.01); H01L 24/03 (2013.01); H01L 24/32 (2013.01); H01L 24/48 (2013.01); H01L 24/73 (2013.01); H01L 25/0657 (2013.01); H01L 2221/6835 (2013.01); H01L 2221/68359 (2013.01); H01L 2224/03002 (2013.01); H01L 2224/0557 (2013.01); H01L 2224/08147 (2013.01); H01L 2224/32145 (2013.01); H01L 2224/32225 (2013.01); H01L 2224/33 (2013.01); H01L 2224/33181 (2013.01); H01L 2224/48091 (2013.01); H01L 2224/48106 (2013.01); H01L 2224/48145 (2013.01); H01L 2224/48227 (2013.01); H01L 2224/73215 (2013.01); H01L 2224/73265 (2013.01); H01L 2224/80006 (2013.01); H01L 2225/0651 (2013.01); H01L 2225/06506 (2013.01); H01L 2225/06562 (2013.01); H01L 2225/06586 (2013.01)

(58) Field of Classification Search
CPC ............ H01L 2225/0651; H01L 24/48; H01L 2224/33181; H01L 21/6835; H01L 2224/32145; H01L 2224/48227; H01L 2224/33; H01L 2224/08147; H01L 24/03; H01L 2225/06562; H01L 24/32; H01L 2224/48145; H01L 2224/73265; H01L 2224/80006; H01L 2224/03002; H01L 2224/73215; H01L 2221/6835; H01L 2224/48106; H01L 25/0657; H01L 2225/06506; H01L 2224/48091
See application file for complete search history.

(56) References Cited

U.S. PATENT DOCUMENTS

| | | |
|---|---|---|
| 9,530,790 B1 | 12/2016 | Lu et al. |
| 9,558,915 B2 | 1/2017 | Fukuzumi et al. |
| 10,355,009 B1* | 7/2019 | Kai .................. H01L 27/11582 |
| 2014/0061750 A1 | 3/2014 | Kwon et al. |
| 2015/0333056 A1* | 11/2015 | Du ..................... H01L 27/0688 257/773 |
| 2016/0079164 A1* | 3/2016 | Fukuzumi ......... H01L 27/11582 257/324 |
| 2016/0233264 A1* | 8/2016 | Kagawa .............. H01L 27/1464 |
| 2018/0047744 A1* | 2/2018 | Utsumi ................ H01L 29/792 |
| 2018/0374864 A1* | 12/2018 | Fukuzumi ......... H01L 27/11568 |
| 2019/0081069 A1* | 3/2019 | Lu ....................... H01L 27/1157 |
| 2019/0221557 A1* | 7/2019 | Kim .................. H01L 27/11565 |
| 2019/0229125 A1* | 7/2019 | Zhou .................. H01L 23/5226 |
| 2019/0252404 A1* | 8/2019 | Kaminaga ......... H01L 27/11565 |
| 2019/0273090 A1* | 9/2019 | Fukuzumi ......... H01L 27/11573 |
| 2019/0371807 A1* | 12/2019 | Nishikawa ........ H01L 27/11573 |
| 2020/0006270 A1* | 1/2020 | Lee .................. H01L 27/11529 |
| 2020/0006299 A1* | 1/2020 | Liu .................. H01L 21/4857 |
| 2020/0027509 A1* | 1/2020 | Chen .................. H01L 27/2436 |
| 2020/0027835 A1* | 1/2020 | Hsu .................. H01L 29/0653 |
| 2020/0027892 A1* | 1/2020 | Zhu .................. H01L 21/76802 |
| 2020/0035694 A1* | 1/2020 | Kaminaga ......... H01L 27/11521 |
| 2020/0066703 A1* | 2/2020 | Kim .................. H01L 27/11565 |

\* cited by examiner

SEMICONDUCTOR DEVICE

CROSS-REFERENCE TO RELATED
APPLICATION(S)

This application claims priority under 35 U.S.C. § 119 to Korean Patent Application No. 10-2018-0135264, filed on Nov. 6, 2018 in the Korean Intellectual Property Office (KIPO), the disclosure of which is incorporated by reference in its entirety herein.

1. TECHNICAL FIELD

The present inventive concepts relate to a semiconductor device.

2. DISCUSSION OF RELATED ART

While sizes of semiconductor devices have been reduced, semiconductor devices are still required to process large amounts of data. Therefore, it is desirable to increase the degree of integration of such semiconductor devices.

SUMMARY

An aspect of the present inventive concepts is to provide a semiconductor device having increased integration density and improved reliability.

According to an example embodiment of the present inventive concepts, a semiconductor device includes a first substrate structure having a first substrate, circuit elements disposed on the first substrate, and first bonding pads disposed on the circuit elements. A second substrate structure is connected to the first substrate structure. The second substrate structure includes a second substrate having first and second surfaces disposed to oppose each other. First and second conductive layers are disposed on the first surface of the second substrate and are spaced apart from each other. A pad insulating layer is disposed on the first and second conductive layers and includes an opening exposing a portion of the second conductive layer. Gate electrodes are stacked to be spaced apart from each other on the second surface of the second substrate in a first direction, perpendicular to the second surface. The gate electrodes are configured to extend by different lengths in a second direction, parallel to the second surface, and are configured to electrically connect to the circuit elements. First contact plugs extend on the second surface of the second substrate in the first direction and connect to the gate electrodes. A second contact plug extends on the second surface of the second substrate in the first direction and electrically connects to the second conductive layer. Second bonding pads electrically connect to the first and second contact plugs and are disposed on the first and second contact plugs to correspond to the first bonding pads.

According to an example embodiment of the present inventive concepts, a semiconductor device includes a first substrate structure having a first substrate, circuit elements disposed on the substrate, and first bonding pads disposed on the circuit elements. A second substrate structure is connected to the first substrate structure. The second substrate structure includes a second substrate. Gate electrodes are stacked to be spaced apart from each other on a bottom surface of the second substrate in a first direction that is perpendicular to the bottom surface of the second substrate. The gate electrodes extend by different lengths in a second direction that is parallel to the bottom surface of the second substrate. The gate electrodes are electrically connected to the circuit elements. A first conductive layer is disposed on the second substrate above the gate electrodes. A second conductive layer is spaced apart from the first conductive layer horizontally at the same height level as the first conductive layer. A pad insulating layer is disposed on the first and second conductive layers and includes an opening exposing portions of the second conductive layer. First contact plugs extend on the bottom surface of the second substrate in the first direction and connect to the gate electrodes and the substrate. Second bonding pads electrically connect to the first contact plugs and are disposed on the first contact plugs to correspond to the first bonding pads. An electrical signal may be applied to the first conductive layer through the first contact plug and the second substrate.

According to an example embodiment of the present inventive concepts, a semiconductor device includes a first substrate structure having a first substrate. Semiconductor elements are disposed on the substrate. First bonding pads are disposed on the semiconductor elements. A second substrate structure is connected to the first substrate structure. The second substrate structure includes a second substrate. Gate electrodes are stacked to be spaced apart from each other on a bottom surface of the second substrate in a direction perpendicular to the bottom surface of the second substrate. The gate electrodes electrically connect to the semiconductor elements. A first conductive layer is disposed on the second substrate above the gate electrodes. A second conductive layer is spaced apart from the first conductive layer horizontally and is electrically connected to an external device. A pad insulating layer is disposed on the first and second conductive layers. First contact plugs extend on the bottom surface of the second substrate in the direction perpendicular to the bottom surface of the second substrate and connect to the gate electrodes and the second substrate. A second contact plug extends on the bottom surface of the second substrate in the direction perpendicular to the bottom surface of the second substrate and electrically connects to the second conductive layer. Second bonding pads electrically connect to the first and second contact plugs and are disposed on the first and second contact plugs to correspond to the first bonding pads.

According to an example embodiment of the present inventive concepts, a method of manufacturing a semiconductor device includes forming a first substrate structure. Circuit elements are formed on a first substrate. First bonding pads are formed and are disposed on the circuit elements. A second substrate structure is formed, which includes forming a pad insulating layer, a first conductive layer, a second conductive layer and a second substrate on a base substrate, the second substrate having first and second surfaces disposed to oppose each other. The first and second conductive layers are patterned to be spaced apart from each other by a cell region insulating layer disposed therebetween. Sacrificial layers and interlayer dielectrics are stacked on the second surface of the second substrate in a first direction, perpendicular to the second surface of the base substrate. Portions of the sacrificial layers and interlayer dielectrics are removed so that the sacrificial layers extend by different lengths in a second direction, parallel to the second surface. The sacrificial layers are removed and gate electrodes are formed in the regions where the sacrificial layers were removed. The gate electrodes are configured to extend by different lengths in the second direction. First contact plugs are formed to extend on the second surface of the second substrate in the first direction and are connected to the gate electrodes. A second contact plug is formed to extend on the second surface of the second substrate in the first direction and is electrically connected to the second conductive layer. Second bonding pads are formed on the second conductive plugs. The first substrate structure and second substrate structure are connected by bonding the first bonding pads and the second bonding pads to each other. The base substrate is removed to form an opening that exposes a portion of the second conductive layer.

BRIEF DESCRIPTION OF DRAWINGS

The above and other aspects, features, and advantages of the present disclosure will be more clearly understood from the following detailed description of example embodiments of the present inventive concepts, taken in conjunction with the accompanying drawings, in which.

DETAILED DESCRIPTION OF THE EXAMPLE EMBODIMENTS

Hereinafter, example embodiments of the present inventive concepts will be described with reference to the accompanying drawings.

Figure 1:
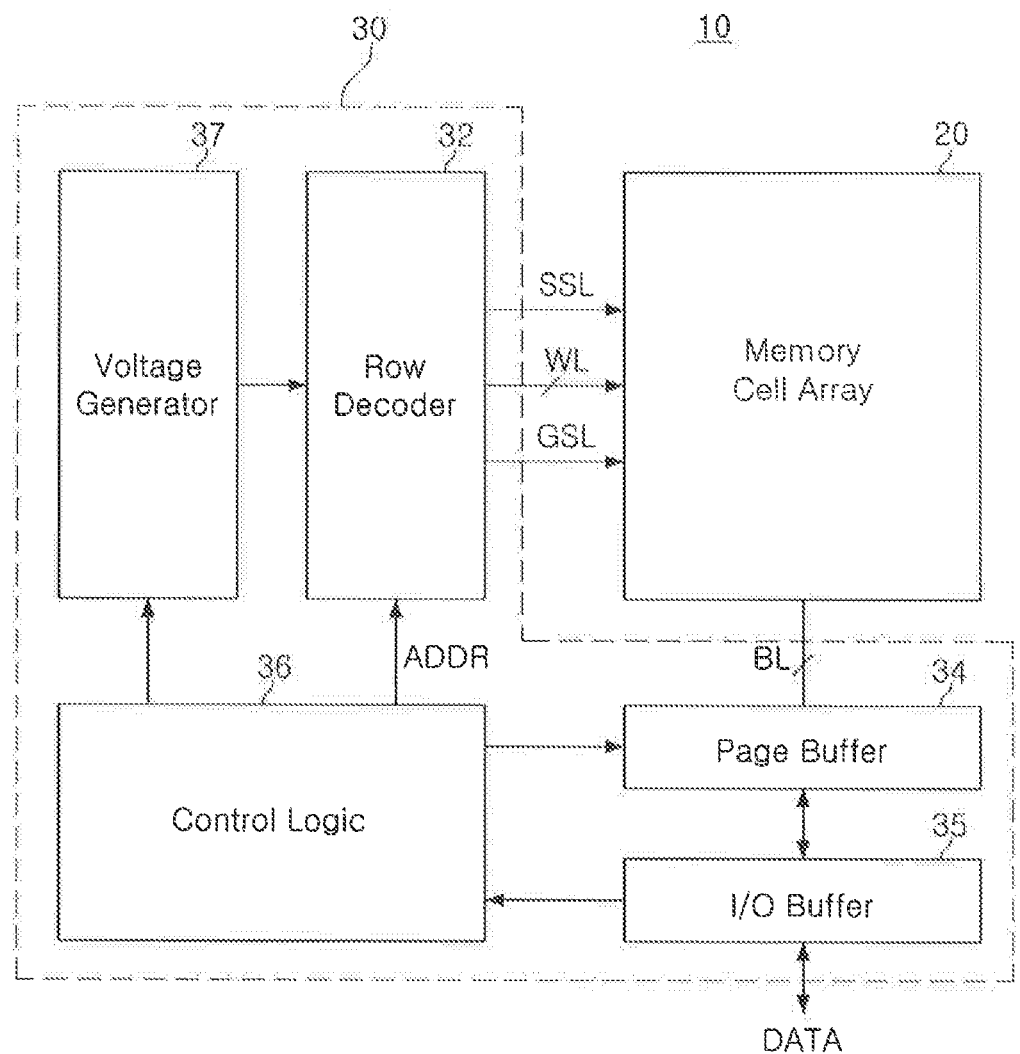
FIG. 1 is a block diagram of a semiconductor device according to an example embodiment of the present inventive concepts.

Referring to FIG. 1, a semiconductor device 10 may include a memory cell array 20 and a peripheral circuit 30. The peripheral circuit 30 may include a row decoder 32, a page buffer 34, an input/output (I/O) buffer, a control logic 36, and a voltage generator 37.

The memory cell array 20 may include a plurality of memory blocks. Each of the memory blocks may include a plurality of memory cells. The plurality of memory cells may be connected to the row decoder 32 through a string select line SSL, a plurality of wordlines WL, and a ground selection line GSL. The plurality of memory cells may be connected to a page buffer 34 through bitlines BL. In example embodiments, a plurality of memory cells arranged in the same column may be connected to the same wordline WL. A plurality of memory cells arranged in the same row may be connected to the same bitline BL.

The row decoder 32 may be configured to decode an input address ADDR to generate and transmit driving signals of the wordline WL. The row decoder 32 may provide a wordline voltage, generated by a voltage generator 37, to a selected wordline WL and unselected wordlines WL in response to control signals of the control logic 36.

The page buffer 34 may be connected to the memory cell array 20 through the bitlines BL and may be configured to read information stored in the memory cells. The page buffer 34 may be configured to temporarily store data to be stored in the memory cells or sense data stored in the memory cells according to an operation mode. The page buffer 34 may include a column decoder and a sense amplifier. The column decoder may be configured to selectively activate the bitlines BL of the memory cell array 20. The sense amplifier may be configured to sense a voltage of a bitline BL, selected by the column decoder, to read data stored in a selected memory cell during a reading operation.

The I/O buffer 35 may be configured to receive and transmit data DATA to the page buffer 34 during a programming operation. The I/O buffer 35 may be configured to output the data DATA transmitted from the page buffer 34 to an external device during a reading operation. The I/O buffer 35 may be configured to transmit an input address or command to the control logic 36.

The control logic 36 may be configured to control operations of the row decoder 32 and the page buffer 34. The control logic 36 may be configured to receive a control signal and an external voltage, transmitted from an external device. The control logic 36 may operate according to the received control signal. The control logic 36 may control reading, writing, and/or erasing operations in response to the control signals.

The voltage generator 37 may be configured to generate voltages that are required for internal operations, such as a programming voltage, a reading voltage, an erasing voltage, and the like using the external voltage. A voltage generated by the voltage generator 37 may be transmitted to the memory cell array 20 through the row decoder 32.

Figure 2:
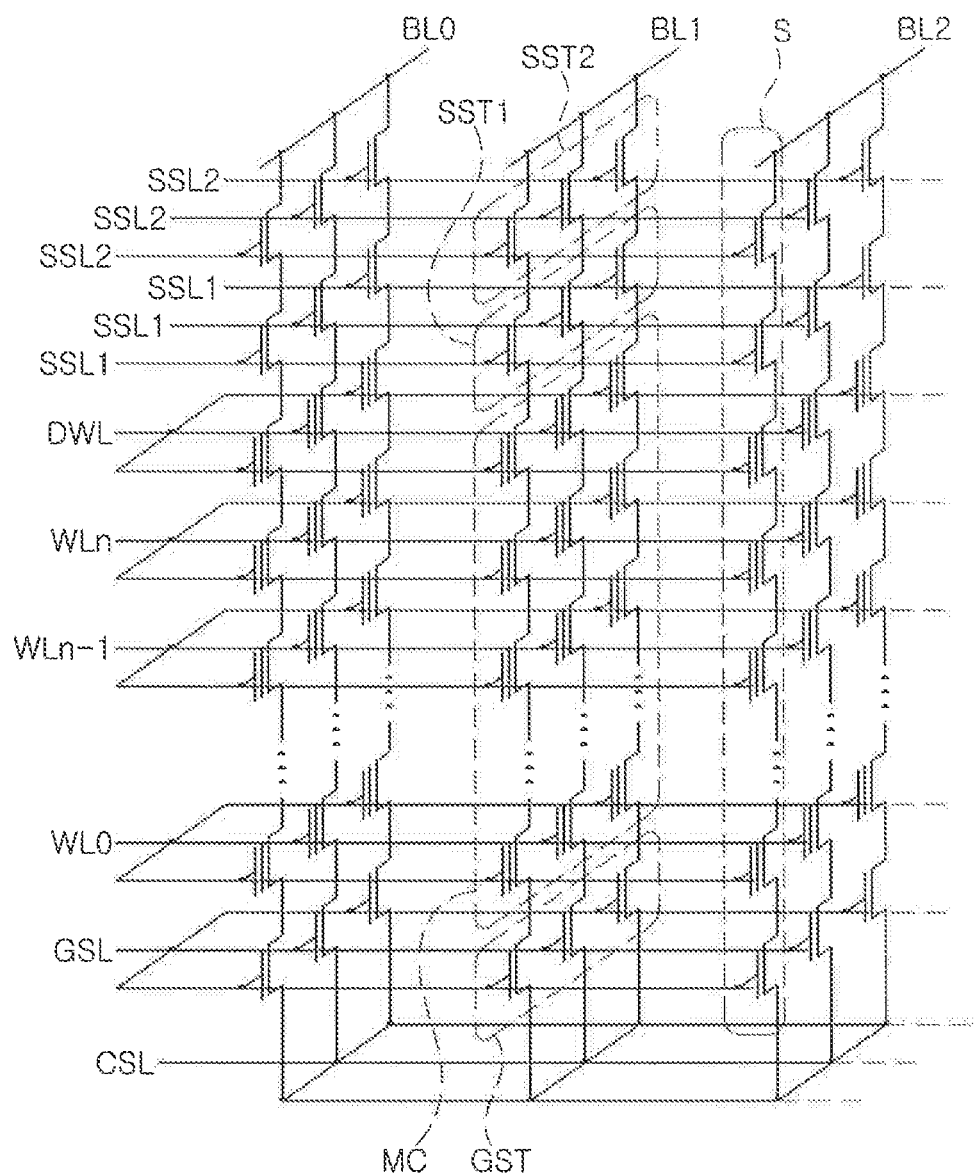
FIG. 2 is an equivalent circuit diagram of a cell array of a semiconductor device according to an example embodiment of the present inventive concepts.

Referring to the example embodiment of the present inventive concepts shown in FIG. 2, a memory cell array 20 may include a plurality of memory cell strings S including memory cells MC, connected to each other in series, as well as a ground select transistor GST and string select transistors SST1 and SST2 connected to opposite ends of the memory cells MC in series. The plurality of memory cell strings S may be connected to the bitlines BL0 to BL2 in parallel, respectively. The plurality of memory cell strings S may be commonly connected to a common source line CSL. For example, a plurality of memory cell strings may be disposed between a plurality of bitlines BL0 to BL2 and a single common source line CSL. In example embodiments, a plurality of common source lines CSL may be two-dimensionally arranged.

The memory cells MC, connected to each other in series, may be controlled by wordlines WL0 to WLn for selecting the memory cells MC. Each of the memory cells MC may include a data storage component. In example embodiments, gate electrodes of the memory cells MC, disposed at substantially the same distance from the common source line CSL, may be commonly connected to one of the wordlines WL0 to WLn to be in an equipotential state. In alternative example embodiments, even when the gate electrodes of the memory cells MC are disposed at substantially the same distance from the common source line CSL, gate electrodes disposed at different rows or columns may be independently controlled.

The ground select transistor GST may be configured to be controlled by the ground selection line GSL and connected to the common source line CSL. The string select transistor SST1 and SST2 may be configured to be controlled by the string select lines SSL1 and SSL2 and connected to the bitlines BL0 to BL2. Although FIG. 2 illustrates an example embodiment in which one ground select transistor GST and two string select transistors SST1 and SST2 are connected to each of the plurality of memory cells MC, one string select transistor SST1 or SST2 or a plurality of ground select transistors GST may be connected thereto. One or more dummy lines DWL or a buffer line may be further disposed between an uppermost wordline WLn, among the wordlines WL0 to WLn, and the string select lines SSL1 and SSL2. In example embodiments, one or more dummy lines DWL may also be disposed between a lowermost wordline WL0 and a ground selection line GSL. In the specification, the term "dummy" may be used to indicate a component having a structure and a shape the same as or similar to those of other components, but which is merely present as a pattern without being configured to perform one or more functions of the other components.

When a signal is applied to the string select transistors SST1 and SST2 through the string select lines SSL1 and SSL2, a signal applied through the bitlines BL0 to BL2 may be transmitted to the memory cells MC, connected to each other in series, to perform data reading and writing operations. In addition, a predetermined erasing voltage may be applied through a substrate to perform an erasing operation to erase data written to the memory cells MC. In example embodiments, the memory cell array 20 may include at least one dummy memory cell string electrically separated from the bitlines BL0 to BL2.

Figure 3:
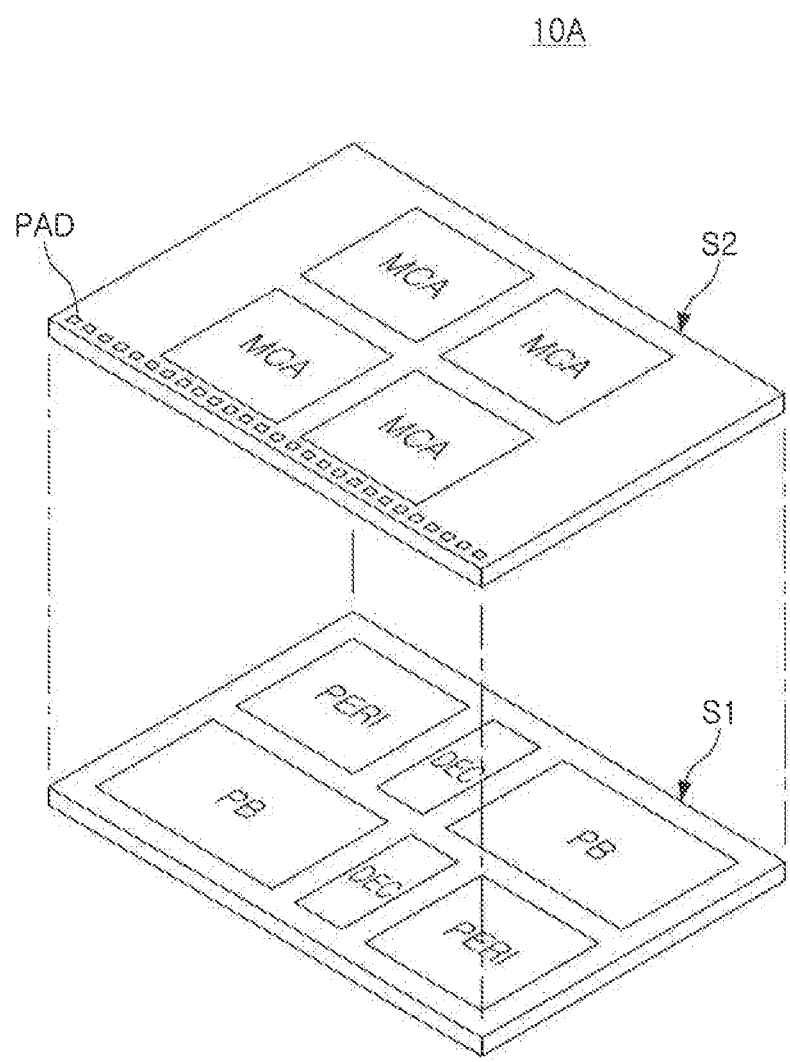
FIG. 3 is a layout diagram illustrating an arrangement of a semiconductor device according to an example embodiment of the present inventive concepts.

Referring to the example embodiment of the present inventive concepts shown in FIG. 3, a semiconductor device 10A may include first and second substrate structures S1 and S2 stacked in a vertical direction. The first substrate structure S1 may constitute a peripheral circuit 30 in FIG. 1, and the second substrate structure S2 may constitute the memory cell array 20 in FIG. 1.

The first substrate structure S1 may include a row decoder DEC, a page buffer PB, and other peripheral circuits PERI. The row decoder DEC may correspond to the row decoder 32 described with reference to FIG. 1, and the page buffer PB may be a region corresponding to the page buffer 34. The other peripheral circuits may be a region including the control logic 36 and the voltage generator 37 in FIG. 1 and may include, for example, a latch circuit, a cache circuit, or a sense amplifier. The peripheral circuits PERI may also include the I/O buffer 35 in FIG. 1 and may include an electrostatic discharge (ESD) component or a data input/output circuit. In example embodiments, the I/O buffer 35 may be disposed in such a manner that a separate region is formed at a circumference of the other peripheral circuit PERI.

In the first substrate structure S1, at least some of the various circuit regions, such as the row decoder DEC, the page buffer PB, and the peripheral circuits PERI may be disposed below memory cell arrays MCA of the second substrate structure S2. For example, the page buffer PB and the peripheral circuits PERI may be disposed below memory cell arrays MCA to overlap the memory cell arrays MCA. However, in example embodiments, the circuits included in the first substrate structure S1 and the arrangement of such circuits may be variously changed. Similarly, the circuits disposed to overlap the memory cell arrays MCA and their arrangement may also be variously changed. Additionally, in example embodiments, the circuit regions DEC, PB, and PERI may have a shape, in which the arrangement form illustrated in FIG. 3 is continuously repeated, depending on the number and a size of the memory cell arrays MCA.

The second substrate structure S2 may include memory cell arrays MCA and pad regions PAD. The memory cell arrays MCA may be disposed side by side by and are spaced apart from each other. However, in example embodiments, the number of the memory cell arrays MCA disposed on the second substrate structure S2 and their arrangement thereon may be variously changed. The pad regions PAD may be disposed on at least one side of the memory cell arrays MCA. For example, in the example embodiment shown in FIG. 3, the pad regions PDA may be disposed in such a manner that a column is formed along at least one edge of the second substrate structure S2. Alternatively, in other example embodiments, the pad regions PAD may be disposed in such a manner that a column is formed in a region between the memory cell arrays MCA. The pad regions PAD may be configured to receive an electrical signal from an external device or the like and transmit an electrical signal to such device. In the semiconductor device 10A, the pad regions PAD may be connected to a circuit in a peripheral circuit PERI of the first substrate structure S1, for example, a circuit corresponding to the I/O buffer 35 in FIG. 1.

Figure 4:
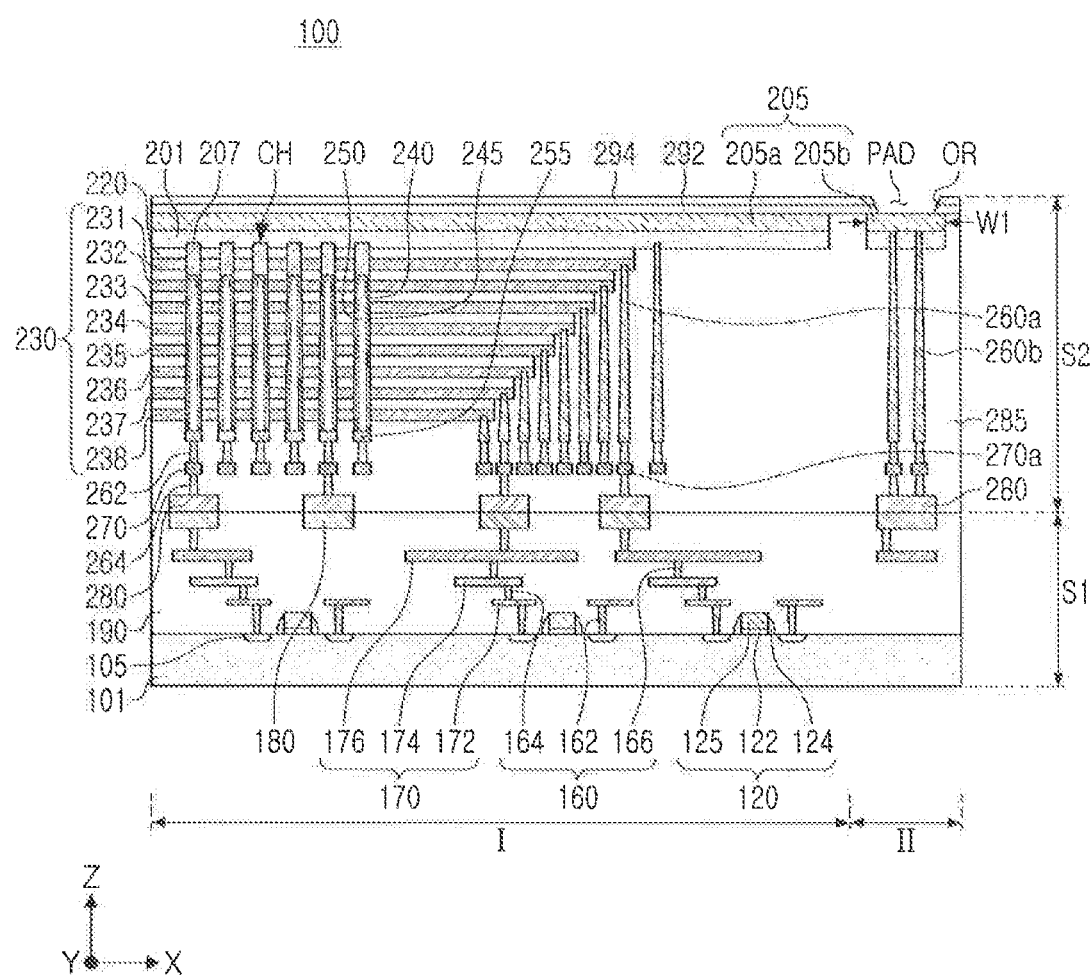
FIG. 4 is a cross-sectional view of a semiconductor device according to an example embodiment of the present inventive concepts.

Referring to the example embodiment of the present inventive concepts shown in FIG. 4, a semiconductor device 100 includes a first substrate structure S1 and a second substrate structure S2, which are vertically stacked. The first substrate structure S1 may include a peripheral circuit region, similarly to the first substrate structure S1 of the example embodiment shown in FIG. 3. The second substrate structure S2 may include a memory cell region, similarly to the second substrate structure S2 of the example embodiment shown in FIG. 3.

The first substrate structure S1 may include a first substrate 101, circuit elements 120 disposed on the first substrate 101, circuit contact plugs 160, circuit interconnection lines 170, and first bonding pads 180.

The first substrate 101 may have a top surface extending in an X direction and a Y direction. Separate device isolation layers may be formed on the first substrate 101 to define active regions. Source/drain regions 105 including impurities may be formed in a portion of the active region. The first substrate 101 may include a semiconductor material such as a Group IV semiconductor, a Group III-V compound semiconductor, or a Group II-VI compound semiconductor. For example, the first substrate 101 may be provided as a single-crystal bulk wafer.

The circuit elements 120 may include a horizontal transistor. Each of the circuit elements 120 may include a circuit gate dielectric layer 122, a spacer layer 124, and a circuit gate electrode 125. Source/drain regions 105 may be formed in the first substrate 101 at opposite sides adjacent to the circuit gate electrode 125.

A peripheral region insulating layer 190 may be disposed on the circuit elements 120 on the first substrate 101. The circuit contact plugs 160 may be connected to the source/drain regions 105 through the peripheral region insulating layer 190, and may include first to third circuit contact plugs 162, 164, and 166 sequentially disposed from the first substrate 101. An electrical signal may be applied to the circuit element 120 by the circuit contact plugs 160. In a region, the circuit contact plugs 160 may also be connected to the circuit gate electrode 125. The circuit interconnection lines 170 may be connected to the circuit contact plugs 160, and may include first to third interconnection lines 172, 174, and 176 constituting a plurality of layers.

The first bonding pads 180 may be configured to be connected to the third circuit contact plug 166. Therefore, the top surfaces of the first bonding pads 180 may be exposed to a top surface of the first substrate structure S through the peripheral region insulating layer 190. The first bonding pads 180 may serve as a bonding layer for bonding the first substrate structure S1 and the second substrate structure S2 together with the second bonding pads 280. The first bonding pads 180 may have larger planar areas than the other interconnection structures to be bonded to the second substrate structure S2 and provides an electrical connection path. The first bonding pads 180 may be disposed in positions corresponding to the second bonding pads 280, respectively, and may have the same or similar sizes than the second bonding pads 280. The first bonding pads 180 may include a conductive material, for example, copper (Cu).

The second substrate structure S2 may include a second substrate 201, gate electrodes 230, which are illustratively shown as gate electrodes 231 to 238, interlayer dielectrics 220 alternatively stacked with the gate electrodes 230, channels CH disposed to penetrate the gate electrodes, a cell region insulating layer 285 disposed to cover the gate electrodes, a conductive layer 205 and first and second pad insulating layers 292 and 294 sequentially stacked on a top surface of the second substrate 201. The second substrate structure S2 may further include first cell contact plugs 260a that are configured to apply a signal to the gate electrodes 230 and the second substrate 201. The second substrate structure S2 may further include second cell contact plugs 260b electrically connected to the second conductive layer 205b, first conductive plugs 262, bitlines 270 and 270a, second conductive plugs 264, and second bonding pads 280, as interconnection structures.

The second substrate 201 may have a first region I, in which the gate electrodes 230 are vertically stacked, and a second region II spaced apart from the gate electrodes 230 in a horizontal direction, for example, an X direction. The first region I may include a region, in which the gate electrodes 230 corresponding to the memory cell array 20 in FIG. 1 are vertically stacked and the channels CH are disposed. A region for electrically connecting the memory cell array 20 to the peripheral circuit 30 in FIG. 1, may be a region in which the gate electrodes 230 extend by different lengths. The second region II may include a region in which a pad region PAD corresponding to the pad region PAD in FIG. 3 is disposed. The second region II may be disposed outside of the first region I on a plane when viewed from above. The second substrate 201 may be connected to at least one first cell contact plug 260a. The first cell contact plug may be spaced apart from channel regions 240 of the channel CH.

The second substrate 201 may have a bottom surface extending in an X direction and a Y direction. The second substrate 201 may include a semiconductor material, such as a Group IV semiconductor, a Group III-V compound semiconductor, or a Group II-VI semiconductor. For example, the Group IV semiconductor may include silicon, germanium, or silicon-germanium. For example, the second substrate 201 may be provided as a polycrystalline layer or an epitaxial layer. The second substrate 201 may include a doped region including impurities.

The gate electrodes 230 may be vertically stacked on a bottom surface of the second substrate 201 to form a stacked structure together with the interlayer dielectrics 220. The gate electrodes 230 may include a top gate electrode 231 constituting a gate of the ground select transistor GST in FIG. 2, memory gate electrodes 232 to 236 constituting a plurality of memory cells MC, and bottom gate electrodes 237 and 238 constituting gates of the first and second gate electrodes SST1 and SST2. The number of memory gate electrodes 232 to 236 constituting the memory cells MC may be determined depending on capacitance of the semiconductor device 100. According to an example embodiment, the top and bottom gate electrodes 231 and 237 and 238 of string select transistors SST1 and SST1 and a ground select transistor GST1 may be one or two or more in number, respectively, and may have the same structure or different structures as compared to the gate electrodes 230 of the memory cells MC. Some of the gate electrodes 230, for example, memory gate electrodes 232 to 236 adjacent to the top and bottom gate electrodes 231, 237, and 238 may be dummy gate electrodes.

The gate electrodes 230 may be vertically stacked on a bottom surface of the second substrate 201 to be spaced apart from each other, and extend in at least one direction to different lengths to form a staircase-like step. The gate electrodes 230 may be disposed to form a step, shown in FIG. 4, in the X direction and to form a step in the Y direction. A predetermined region, including end portions of the gate electrodes 230, may be exposed by the steps. In the regions, the gate electrodes 230 may be connected to first cell contact plugs 260a.

The gate electrodes 230 may be disposed to be separated in predetermined units by separation regions in the Y direction. The gate electrodes 230 may constitute a single memory block between a pair of the separation regions, but the scope of the memory block is not limited thereto. Some of the gate electrodes 230, for example, the memory gate electrodes 232 to 236 may constitute a single layer in a single memory block.

The interlayer dielectrics 220 may be disposed between the gate electrodes 230. Similarly to the gate electrodes 230, the interlayer dielectrics 220 may be spaced apart from each other in a direction perpendicular to the bottom surface of the second substrate 201 and may extend in the X direction. The interlayer dielectrics 220 may include an insulating material, such as a silicon oxide or a silicon nitride.

The channels CH may be spaced apart from each other, while forming rows and columns, on the bottom surface of the second substrate 201 in the first region I of the second substrate 201. In example embodiments, the channels CH may be disposed to form a lattice pattern or may be disposed in a zigzag manner in one direction. Each of the channels CH may have a pillar shape and may have an inclined side surface which becomes narrower as it comes close to the second substrate 201 depending on an aspect ratio. In example embodiments, some of the channels CH may be dummy channels. The dummy channels may be further disposed outside of the channels CH.

A channel region 240 may be disposed in each of the channels CH. In each of the channels CH, the channel region 240 may be formed to have an annular shape surrounding a channel insulating layer 250 therein. However, in other example embodiments, the channel region 240 may be formed to have a circular shape or a prismatic shape without the channel insulation layer 250. The channel region 240 may be connected to an epitaxial layer 207 at an upper portion of the channel region 240. The channel region 240 may include a semiconductor material, such as polycrystalline silicon or monocrystalline silicon. The semiconductor material may be an undoped material or a material containing p-type or n-type impurities.

In the channels CH, channel pads 255 may be disposed in lower portions of the channel region 240. The channel pads 255 may be disposed to cover a lower surface of the channel insulation layer 250 and to be electrically connected to the channel region 240. The channel pads 255 may include, for example, doped polysilicon.

A gate dielectric layer 245 may be disposed between the gate electrodes 230 and the channel region 240. Although not illustrated in detail, the gate dielectric layer 245 may include a tunneling layer, a charge storage layer, and a blocking layer which are sequentially stacked from the channel region 240. The tunneling layer may be configured to tunnel charges to the charge storage layer and may include, for example, silicon oxide ($SiO_2$), silicon nitride ($Si_3N_4$), silicon oxynitride (SiON), or combinations thereof. The charge storage layer may be a charge trapping layer or a floating gate conductive layer. The blocking layer may include silicon oxide ($SiO_2$), silicon nitride ($Si_3N_4$), silicon oxynitride (SiON), a high-k dielectric material, or combinations thereof. In example embodiments, at least a portion of the gate dielectric layer 245 may extend horizontally along the gate electrodes 230.

The epitaxial layer 207 may be disposed on the bottom surface of the second substrate 201 at top ends of the channels CH and may be disposed in a side surface of the at least one gate electrode 230. The epitaxial layer 207 may be disposed in a recessed region of the second substrate 201. The bottom surface of the epitaxial layer 207 may have a level lower than a level of a bottom surface of an uppermost gate electrode 231 and higher than a level of a top surface of an underlying gate electrode 232. However, the levels of the epitaxial layer with respect to the electrodes are not limited to those shown in the drawing. In example embodiments, the epitaxial layer 207 may be omitted. In this embodiment, the channel region 240 may be directly connected to the second substrate 201 or may be connected to a separate conductive layer on the second substrate 201.

The conductive layer 205 may include first and second conductive layers 205a and 205b that are spaced apart from each other. Since the first and second conductive layers 205a and 205b are formed during the same process, they may include the same material and may be located at the same height level to have the same thickness. For example, top surfaces and bottom surfaces of the first and second conductive layers 205a and 205b may be coplanar with each other. The conductive layer 205 may include a metal material such as tungsten (W), aluminum (Al), copper (Cu), tungsten nitride (WN), tantalum nitride (TaN), or combinations thereof.

The first conductive layer 205a is disposed on the upper portion of the first region I of the second substrate 201 and may be disposed to overlap the gate electrodes 230 and the channels CH on a plane when viewed from above. The first conductive layer 205a may serve as the common source line CSL in FIG. 2 in the semiconductor device 100. The first conductive layer 205a may receive an electrical signal through the first cell contact plug 260a and the second substrate 201. Thus, the second substrate 201 may have at least some regions including doped elements. Alternatively, the first conductive layer 205a may be directly connected to the first cell contact plug 260a.

The second conductive layer 205b may be physically and electrically separated from the first conductive layer 205a and may be disposed side by side in the X direction. The first and second regions I and II of the second substrate 201 may be disposed separately from each other, together with the first and second conductive layers 205a and 205b. The second conductive layer 205b may be disposed on the second region II of the second substrate 201 and may be disposed to overlap the second cell contact plugs 260b on a plane when viewed from above. The second conductive layer 205b may be connected to an electrical connection structure, such as a signal transmission medium of a device such as a package on which the semiconductor device 100 is mounted, through a top surface. For example, the second conductive layer 205b, exposed upwardly, may serve as a pad region PAD. The second conductive layer 205b in one direction may have, for example, a width W1 ranging from 50 micrometers (μm) to 200 μm.

In the semiconductor device 100, the second conductive layer 205b may be connected to underlying second cell contact plugs 260b and may be electrically connected to the circuit elements 120 of the first substrate structure S1 in a region through interconnection structures below the second cell contact plugs 260b. The second cell contact plugs 260b may be directly connected to the second conductive layer 205b through the second substrate 201, but the connection thereof is not limited thereto. In example embodiments, the second cell contact plugs 260b may be connected to the second region II of the second substrate 201 and may be electrically connected to the second conductive layer 205b through the second substrate 201.

As described above, in the semiconductor device 100, the second conductive layer 205b is formed using a process of forming the first conductive layer 205a used as the common source line CSL (see FIG. 2). The second conductive layer 205b may be used as a pad area PAD for input/output to an external device to simplify the entire process while significantly decreasing the total thickness.

The first and second pad insulating layers 292 and 294 may be sequentially stacked on the conductive layer 205. The first and second pad insulating layers 292 and 294 have an opening OR formed to expose a portion of the second conductive layer 205b. The second conductive layer 205b may be exposed upwardly by the opening OR. For example, the first and second pad insulating layers 292 and 294 may define a pad region PAD. For example, a plurality of openings OR may be disposed to form a column together with the second conductive layer 205b, as illustrated in FIG. 3. The top surface of the semiconductor device 100 may have a recessed region due to the opening OR. The first and second pad insulating layers 292 and 294 may serve as a passivation layer to protect the semiconductor device 100 and may be used as an etch stop layer during a process, which will be described below in further detail with reference to FIG. 12H.

In example embodiments, the first and second pad insulating layers 292 and 294 may include at least one of silicon oxide, silicon nitride, and silicon carbide. In an example embodiment, the first and second pad insulating layers 292 and 294 may include different materials. The first pad insulating layer 292 may be formed of a material having a relatively improved bonding property to the conductive layer 205, and the second pad insulating layer 294 may be formed of a material having relatively improved bonding property to silicon (S1). For example, the first pad insulating layer 292 may include silicon oxide, and the second pad insulating layer 294 may include silicon nitride. In example embodiments, the number of the first and second pad insulating layers 292 and 294 may be variously changed, and the first and second pad insulating layers 292 and 294 may be a single layer.

The second substrate structure S2 may further include first and second cell contact plugs 260a and 260b, first conductive plugs 262, bitlines 270 and 270a, second conductive plugs 264, and second bonding pads 280, which are interconnection structures for forming an electrical connection to the first substrate structure S1. As described above, the interconnection structures may include a conductive material. The interconnection structures may include, for example, tungsten (W), aluminum (Al), copper (Cu), tungsten nitride (WN), tantalum nitride (TaN), titanium nitride (TiN), or combinations thereof.

The first cell contact plugs 260a are disposed in the first region I of the second substrate 201, and may be connected to the gate electrodes 230 and the second substrate 201 or the first conductive layer 205a through the cell region insulating layer 285. The second cell contact plugs 260b are disposed in the second region II of the second substrate 201, and may be connected to the second conductive layer 205b through the cell region insulating layer 285. The first and second cell contact plugs 260a and 260b may be connected to the first conductive plugs 262 at lower ends of the first and second cell contact plugs. Each of the first and second cell contact plugs 260a and 260b may have a cylindrical shape. In example embodiments, each of the first and second cell contact plugs 260a and 260b may have a inclined side surface which becomes narrower as it comes close to the second substrate 201 depending on an aspect ratio. According to example embodiments, some of the first and second cell contact plugs 260a and 260b may be dummy contact plugs to which an electrical signal is not applied.

The first conductive plugs 262 may be disposed on lower ends of the channels CH and the first and second cell contact plugs 260a and 260b. The bitlines 270 and 270a may be disposed between the first and second cell contact plugs 262 and 264 at lower ends of the first conductive plugs 262. The bitlines may include bitlines 270 connected to the channels CH and bitlines 270a connected to the first cell contact plugs 260a. For example, the bitlines 270 connected to the channels CH may correspond to the bitlines BL0 to BL2 in FIG. 2. The bitlines 270a connected to the first cell contact plugs 260a, may not correspond to the bitlines BL0 to BL2 in FIG. 2, and may be interconnection lines formed at the same level during the same process as the bitlines 270 connected to the channels CH. The bitlines 270a, connected to the first cell contact plugs 260a, are illustrated as being disposed below all of the first conductive plugs 262. However, the disposition of the bitlines connected to the first cell contact plugs 260a is not limited thereto. The second conductive plugs 264 may be disposed below the bitlines 270 and 270a and may be connected to underlying second bonding pads 280.

The second bonding pads 280 are disposed below the second conductive plugs 264 in such a manner that bottom surface of the second bonding pads 280 may be exposed to the bottom surface of the second substrate structure S2 through the cell region insulating layer 285. The second bonding pads 280 may serve as a bonding layer to bond the first substrate structure S1 and the second substrate structure S2, together with the first bonding pads 180. The second bonding pads 280 may have a larger planar area than the other interconnection structures to provide bonding to the first substrate structure S1 and an electrical connection path accordingly. In example embodiments, the second bonding pads 280 may be disposed on the bitlines 270 and 270a, electrically connected to the second bonding pads 280, side by side with the bitlines 270 and 270a in the Z direction, etc.

The second bonding pads 280 may be disposed to form a predetermined pattern in the respective first and second regions I and II. The second bonding pads 280 may be disposed at the same height level in the first and second regions I and II and may have the same size or different sizes. The second bonding pads 280 may have, for example, a rectangular, circular, or elliptical shape on a plane when viewed from above, but the shape thereof is not limited thereto. The second bonding pads 280 may include a conductive material, for example, copper (Cu).

The cell region insulating layer 285 may be formed of an insulating material. In example embodiments, the cell region insulating layer 285 may include a bonding dielectric layer, having a predetermined thickness, at a lower end on which the second bonding pads 280 are disposed. The bonding dielectric layer may also be disposed on a top surface of the first substrate structure S1 to achieve dielectric-to-dielectric bonding. The bonding dielectric layer may serve as a diffusion barrier layer of the second bonding pad 280 and may include at least one of, for example, SiO, SiN, SiCN, SiOC, SiON, and SiOCN.

The first and second substrate structures S and S2 may be bonded to each other by bonding of the first and second bonding pads 180 and 280, for example, copper-to-copper (Cu—Cu) bonding. Since each of the first and second bonding pads 180 and 280 has a relatively larger area than the other components of the interconnection structure, reliability of electrical connection between the first and second substrate structures S1 and S2 may be improved. In example embodiments, the first and second substrate structures S1 and S2 may be bonded to each other by hybrid bonding of the first and second bonding pads 180 and 280 and dielectric-dielectric bonding of the cell region insulating layer 285, disposed at circumferences of the bonding pads 180 and 280 and the peripheral region insulating layer 190.

Figure 5A:
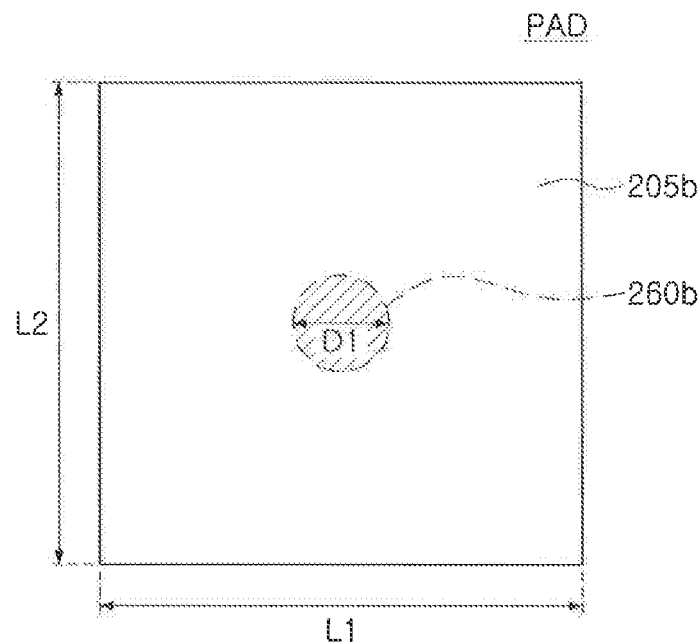
FIGS. 5A and 5B are layout diagrams illustrating some components of a semiconductor device according to an example embodiment of the present inventive concepts.
Figure 5B:
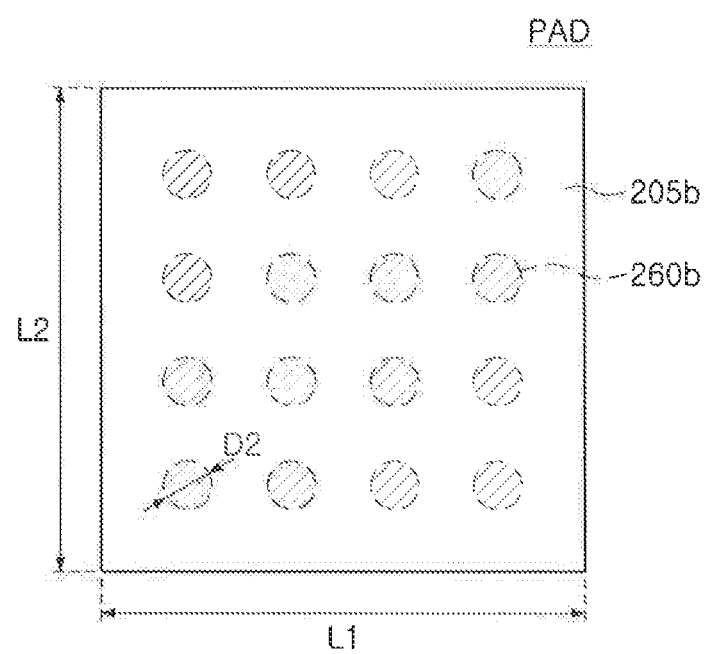

FIGS. 5A and 5B illustrate the arrangement of the second conductive layer 205b and the second cell contact plug 260b in the pad region PAD in FIG. 4, on a plane when viewed from above. FIGS. 5A and 5B illustrate a region in which a second conductive layer 205b is exposed by the openings OR of the first and second pad insulating layers 292 and 294 in FIG. 4 and constitute a single pad region PAD.

In the pad region PAD, the second conductive layer 205b may have a rectangular shape and may have a first length L1 in an X direction and a second length L2 in a Y direction. The first and second lengths L1 and L2 may be equal to each other or different from each other. In example embodiments, the first and second lengths L1 and L2 may range from 20 μm to 100 μm. In example embodiments, the shape of the second conductive layer 205b exposed through the opening OR is not limited to the rectangular shape, and the second conductive layer 205b may have various shapes such as a circle, an ellipse, a polygon, or the like.

As illustrated in the example embodiment shown in FIG. 5A, a single second cell contact plug 260b may be connected to the second conductive layer 205b constituting a single pad region PAD. In example embodiments, a first diameter D1 or a maximum width of the second cell contact plug 260b may have a range from 100 nanometers (nm) to 10 μm. In the example embodiments shown in FIGS. 5A-5B, the second cell contact plug 260b may be disposed in the center of the opening OR. However, the disposition thereof is not limited thereto.

As illustrated in the example embodiments shown in FIG. 5B, a plurality of second cell contact plugs 260b may be connected to the second conductive layer 205b constituting a single pad region PAD. Since supporting force is increased when a wire or the like is bonded to the pad region PAD, stress applied to the semiconductor device may be alleviated. The second cell contact plugs 260b may be disposed to form rows and columns. In an example embodiment, a second diameter D2 or a maximum width of each of the second cell contact plugs 260b may have a range of 100 nm to 500 nm and may be equal to or less than the first diameter D1 in FIG. 5A. The second diameter D2 may be equal or similar to a diameter of the first cell contact plug 260a. In this embodiment, a process of filling a conductive material for forming the first and second cell contact plugs 260a and 260b may be performed simultaneously with formation of the first and second cell contact plugs 260a and 260b. Thus, the process may be easily performed.

Figure 6A:
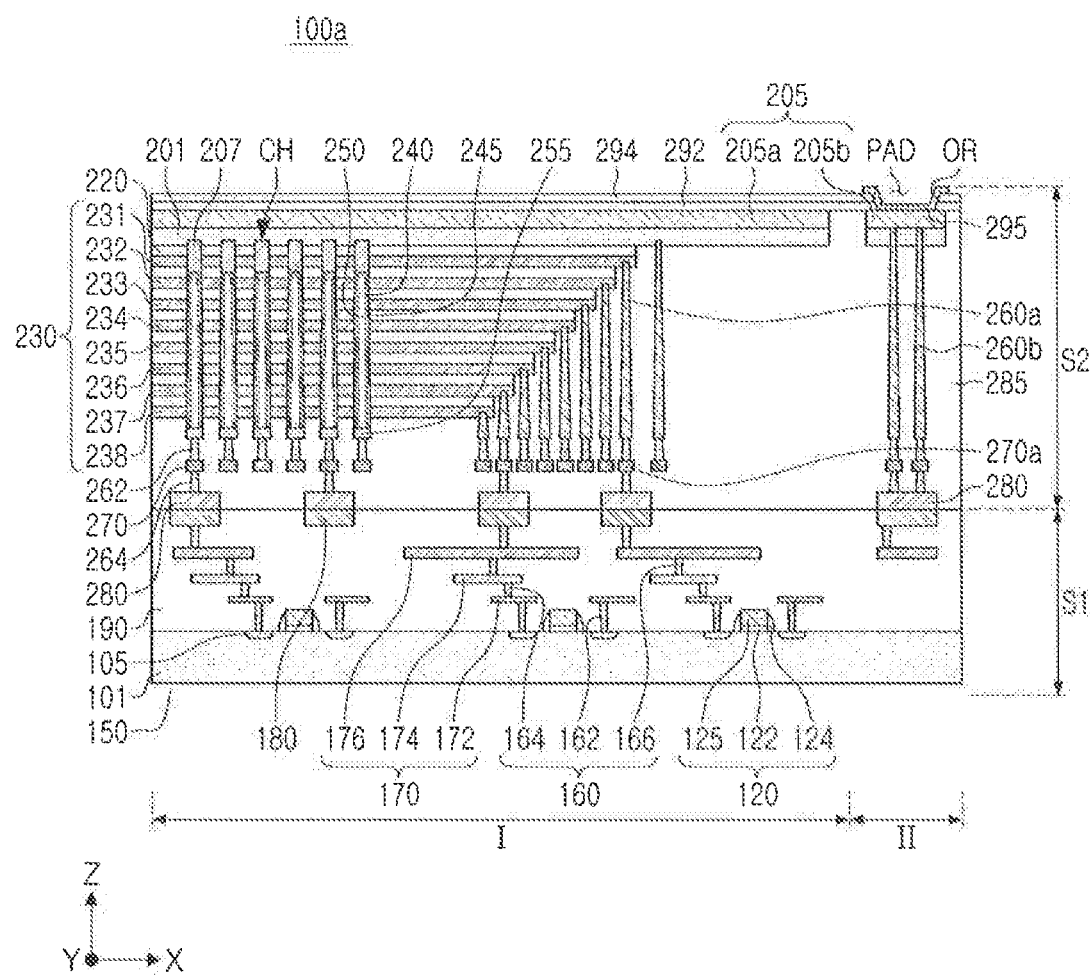
FIGS. 6A and 6B are cross-sectional views of a semiconductor device according to an example embodiment of the present inventive concepts.
Figure 6B:
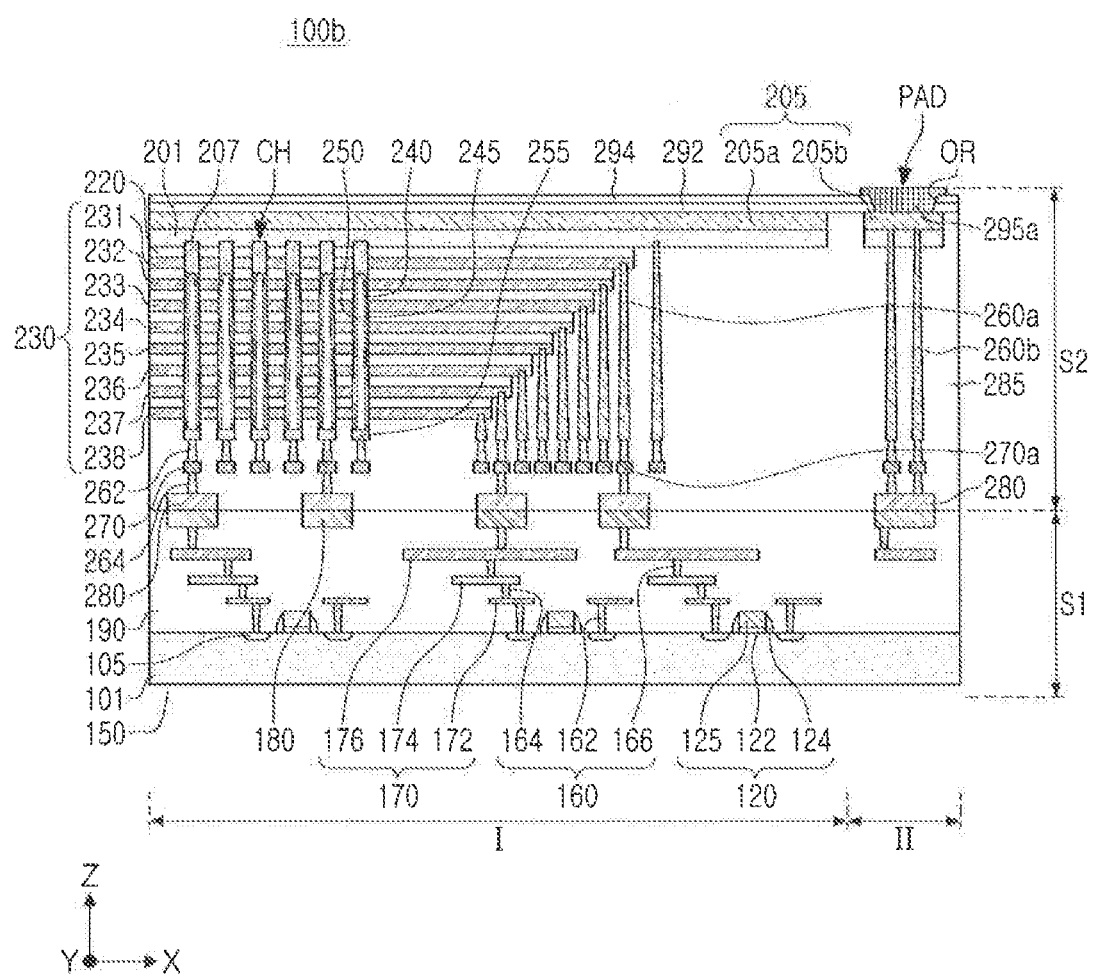

FIGS. 6A and 6B are cross-sectional views of a semiconductor device according to example embodiments of the present inventive concepts.

Referring to FIG. 6A, a second substrate structure S2 of a semiconductor device 100a further includes a connection layer 295 disposed on a second conductive layer 205b in a pad region PAD.

The connection layer 295 is disposed on a top surface of the second conductive layer 205b exposed through openings OR of first and second pad insulating layers 292 and 294. The connection layer 295 may extend from the top surface of the second conductive layer 205b to a top surface of the second pad insulating layer 294 along side surfaces of the first and second pad insulating layers 292 and 294. In example embodiments, the connection layer 295 may be disposed only on an exposed top surface of the second conductive layer 205b. In this embodiment, the connection layer 295 may correspond to a surface treatment layer. The connection layer 295 may include a material that is different from a material of the second conductive layer 205b. For example, the connection layer 295 may include a layer of metal such as aluminum (Al). The connection layer 295 may be composed of a metal material having improved bonding strength due to smooth interdiffusion with an external electrical connection structure, for example, a wire, connected to the exposed second conductive layer 205b, due to smooth interdiffusion with a wire material.

Referring to the example embodiment of the semiconductor device shown in FIG. 6B, a connection layer 295a of a semiconductor device 100b may be disposed on a top surface of a second pad insulating layer 294 to fill an opening OR. The connection layer 295a may have a shape protruding from a top surface of the semiconductor device 100b. The connection layer 295a may include a single layer or multiple layers.

Figure 7:
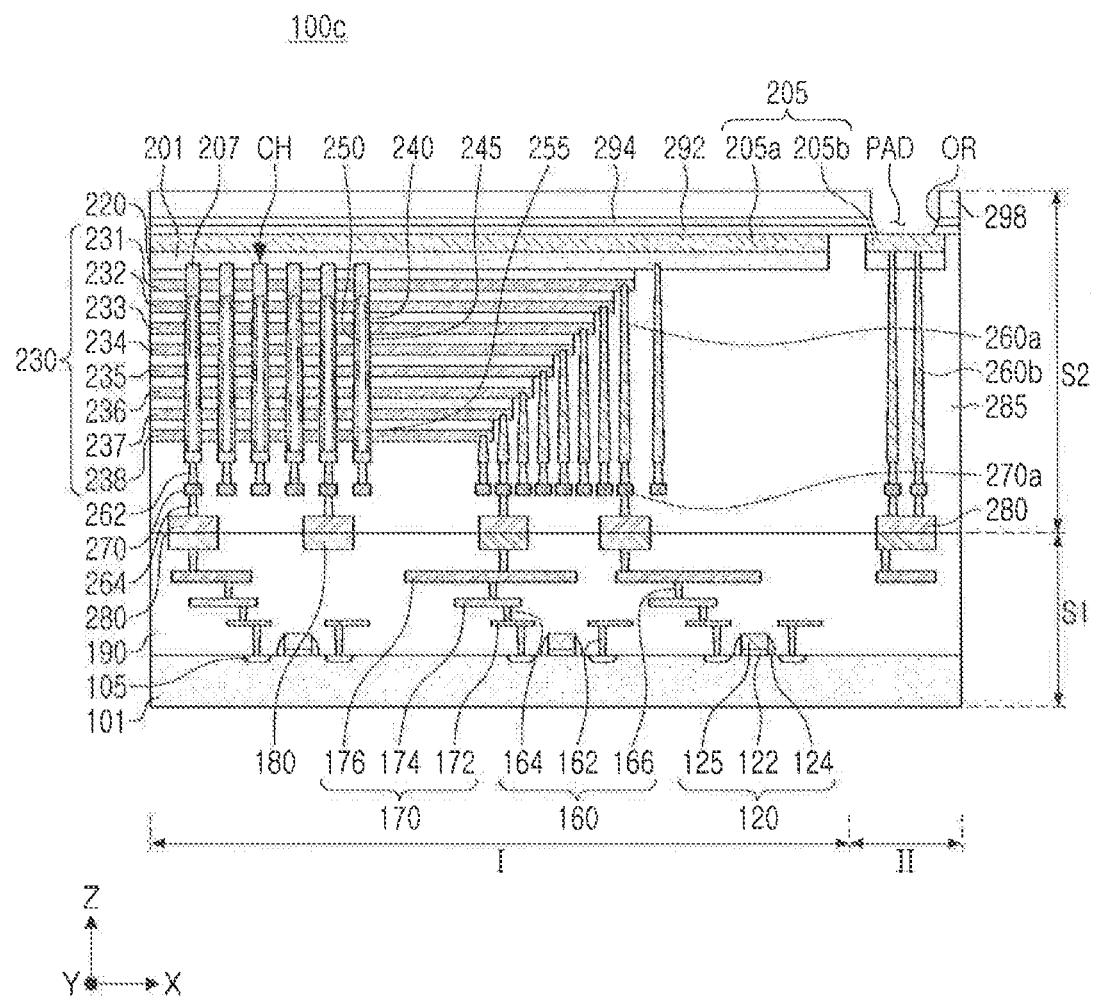
FIG. 7 is a cross-sectional view of a semiconductor device according to an example embodiment of the present inventive concepts.

Referring to the example embodiment of the semiconductor device shown in FIG. 7, a second substrate structure S2 of a semiconductor device 100c further includes a passivation layer 298 disposed on a second pad insulating layer 294. The passivation layer 298 may have openings connected to openings OR of first and second pad insulating layers 292 and 294. Thus, a second conductive layer 205b of the pad region PAD may be exposed upwardly through the opening OR. The passivation layer 298 may be configured to protect the semiconductor device 100c.

In an example embodiment, the passivation layer 298 may have a thickness greater than a thickness of each of the first and second pad insulating layers 292 and 294. The passivation layer 298 may be formed of a photosensitive resin material such as photosensitive polyimide (PSPI), but the material thereof is not limited thereto. The passivation layer 298 may include an insulating material such as a silicon nitride, a silicon oxide, or the like.

Figure 8A:
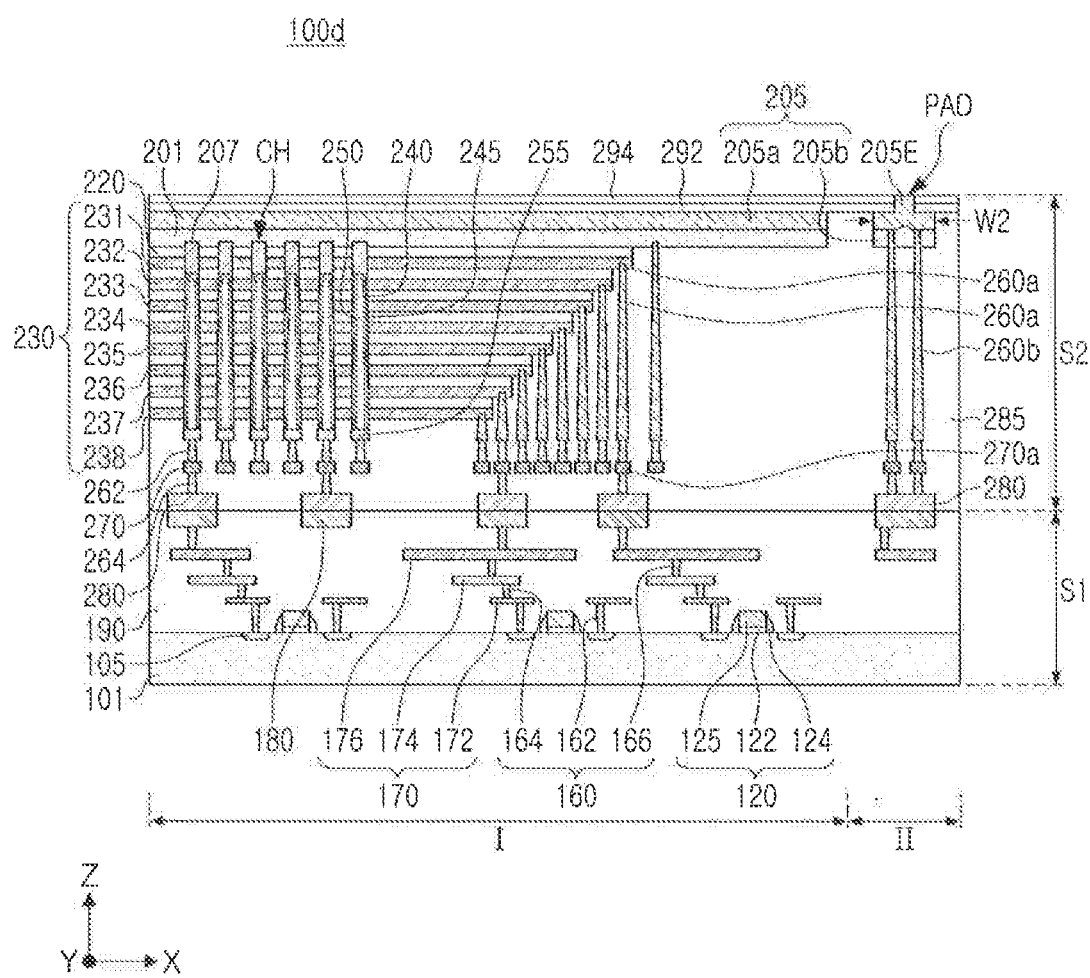
FIGS. 8A and 8B are cross-sectional views of a semiconductor device according to an example embodiment of the present inventive concepts.

In the example embodiment shown in FIG. 8A, in a second substrate structure S2 of a semiconductor device 100d, a second conductive layer 205b in a pad region PAD may further include an extension portion 205E that is configured to extend to penetrate first and second pad insulating layers 292 and 294. Unlike the example embodiment shown in FIG. 4, the semiconductor device 100d may have a shape in which a portion of the second conductive layer 205b is not exposed by openings OR of first and second pad insulating layers 292 and 294. The extension portion 205E of the second conductive layer 205b is exposed upwardly through the first and second pad insulating layers 292 and 294. A bottom surface of the second conductive layer 205b may include a concave portion in a region corresponding to the extension portion 205E. The concave portion may be formed depending on filling of a conductive material for forming the extension portion 205E when the second conductive layer 205b is formed. In example embodiments, the extension portion 205E of the second conductive layer 205b may protrude from a top surface of the second pad insulating layer 294 at a predetermined height. In example embodiments, the extension portion 205E of the second conductive layer 205b may have inclined sidewalls, for example, a tapered shape in which a top surface has a width narrower than a width of a bottom surface. The extension portion 205E may have a cylindrical shape, a tapered cylindrical shape, a trench shape, or the like, but the shape thereof is not limited thereto.

In the pad region PAD, the second conductive layer 205b may have a width W2 that is smaller than the width W1 in the embodiment in FIG. 4. The width W2 may be smaller than width W1 because the extension portion 205E is formed in advance without forming an opening OR in a subsequent process. Therefore, a process margin may be different in the example embodiment shown in FIG. 4, so that the second conductive layer 205b may be formed to be relatively smaller.

Figure 8B:
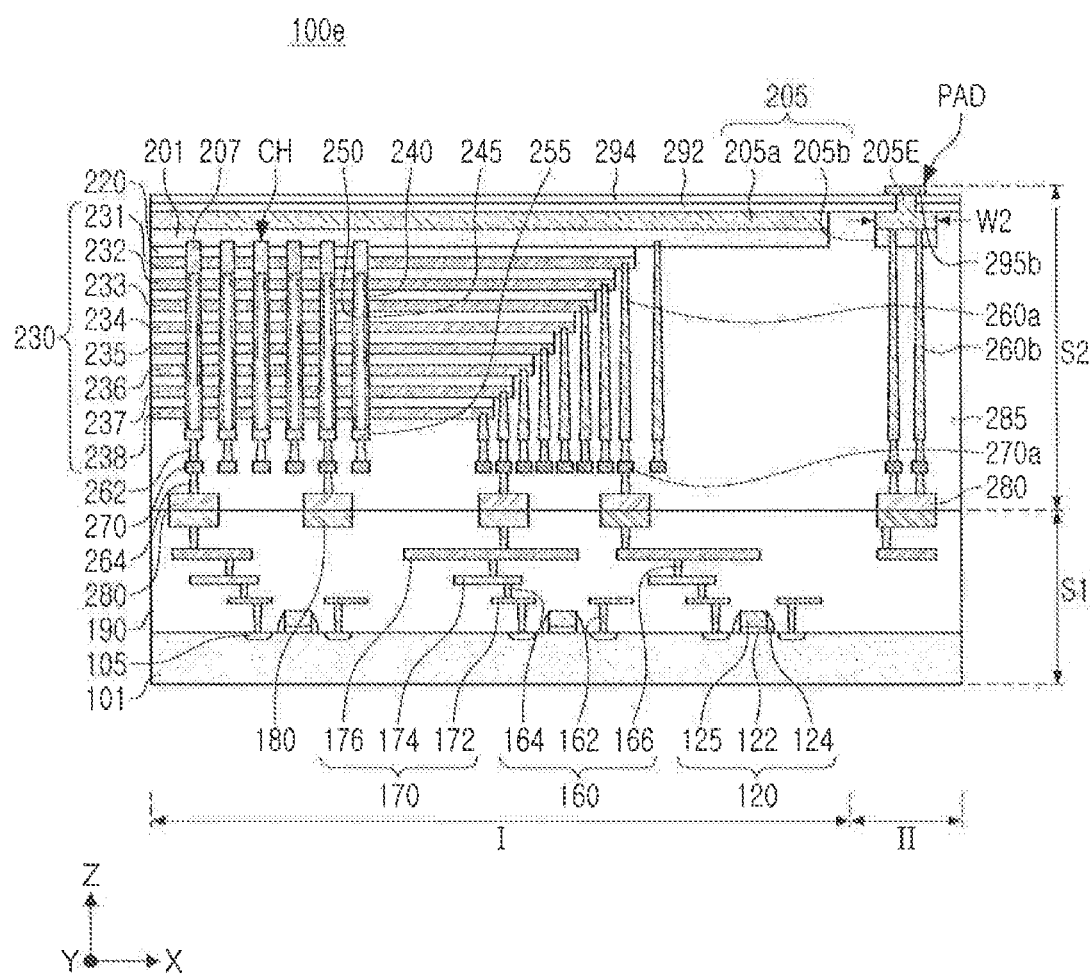

Referring to FIG. 8B, a second substrate structure S2 of a semiconductor device 100e may further include a connection layer 295b disposed on an extension portion 205E of a second conductive layer 205b in a pad region PAD.

The connection layer 295b may be configured to cover a top surface of the extension portion 205E of the second conductive layer 205b and may be disposed to occupy an area that is wider than an area of a top surface of the extension portion 205E. The connection layer 295b may include a material that is different from a material of the second conductive layer 205b. The connection layer 295b may be a layer of metal such as such as aluminum (Al). In the example embodiment shown in FIG. 8B, a bottom surface of the second conductive layer 205b is shown as not including the concave portion as shown in the example embodiment in FIG. 8A. However, the shape thereof is not limited thereto.

Figure 9:
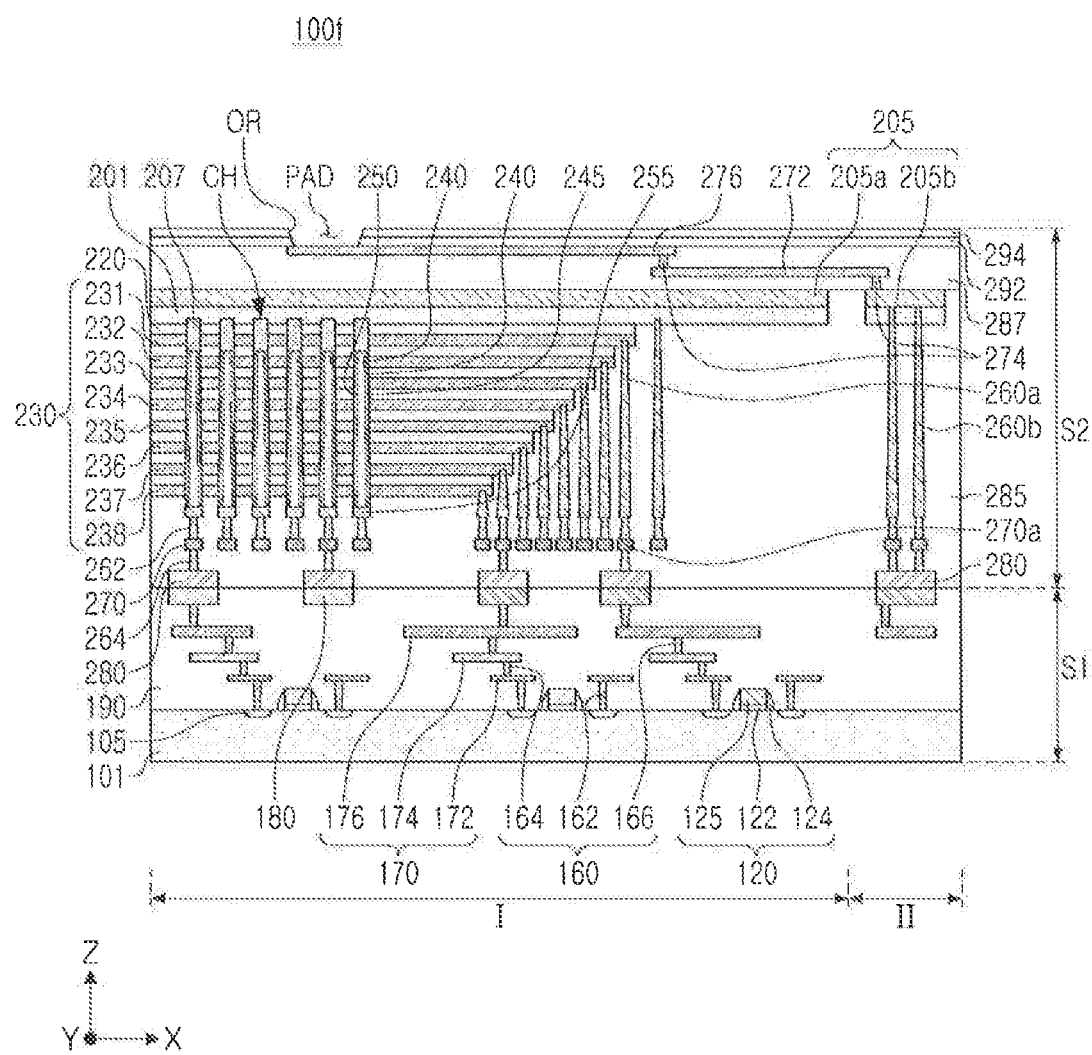
FIG. 9 is a cross-sectional view of a semiconductor device according to an example embodiment of the present inventive concepts.

Referring to the example embodiment of a semiconductor device shown in FIG. 9, a second substrate structure S2 of a semiconductor device 100f may further includes a top insulating layer 287, disposed on a second substrate 201, first and second top interconnection lines 272 and 276 and top vias 274 disposed in the top insulating layer 287.

The top insulating layer 287 may be disposed to cover upper portions of a conductive layer 205 and a cell region insulating layer 285. In example embodiments, the top insulating layer 287 may include an insulating material such as a silicon nitride, a silicon oxide, or the like.

The first and second top interconnection lines 272 and 276 and the top vias 274 may constitute a top interconnection structure electrically connected to a second conductive layer 205b. The top vias 274 may be disposed between the second conductive layer 205b and the first top interconnection line 272 and between the first top interconnection line 272 and the second top interconnection line 276. The number and arrangement of the first and second top interconnection lines 272, 276 and the top vias 274 may vary depending on example embodiments. In an example embodiment, each of the top vias 274 may have a tapered shape in which a top surface is narrower than a bottom surface. First and second pad insulating layers 292 and 294 may be disposed on the second top interconnection line 276, and at least a portion of the second top interconnection line 276 is exposed upwardly by an opening OR to constitute a pad region PAD.

The second conductive layer 205b may be electrically connected to a circuit element 120 of a first substrate structure S1 through underlying second cell contact plugs 260b, and may be electrically connected to the top interconnection structure without direct connection to an external device. Accordingly, an exposed region of the second top interconnection line 276 may serve as a pad region PAD connected to an external electrical structure. As a result, a location of the pad region PAD may be variously changed through the arrangement of the top interconnection structure. The location of the pad region PAD may be an upper portion of a first region I of the second substrate 201, as illustrated in the example embodiment shown in FIG. 9. The pad region PAD may be disposed to overlap gate electrodes 230 or a channel CH. In the present embodiment, since the pad region PAD having a relatively large size may be disposed on a memory cell region of first region I to overlap the gate electrodes 230, the second region II of the second substrate 201 may be formed to have a relatively narrow width and a relatively small area. This may result in a further reduction of the size of the semiconductor device 100d.

Figure 10:
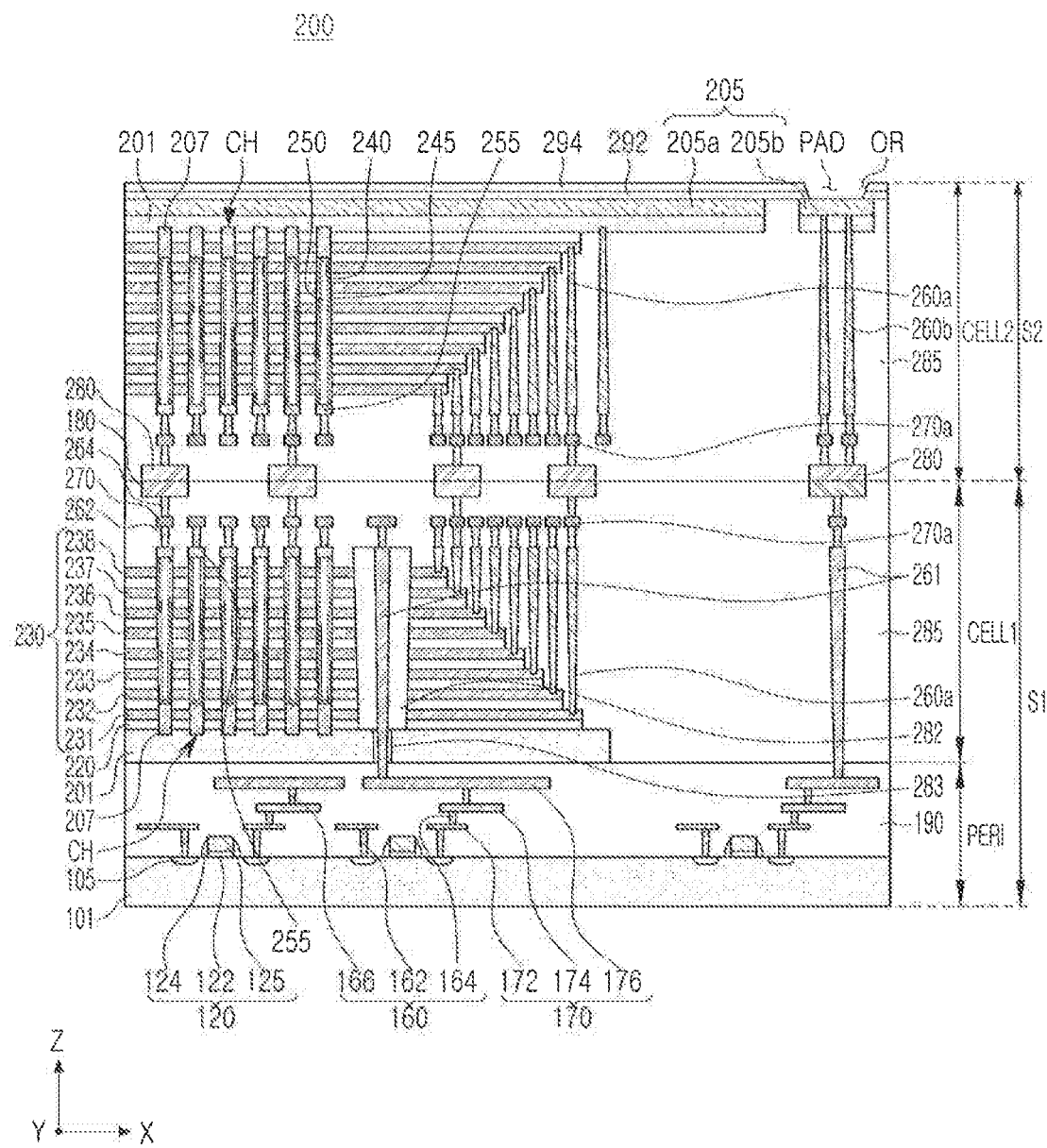
FIG. 10 is a cross-sectional view of a semiconductor device according to an example embodiment of the present inventive concepts.
Figure 11:
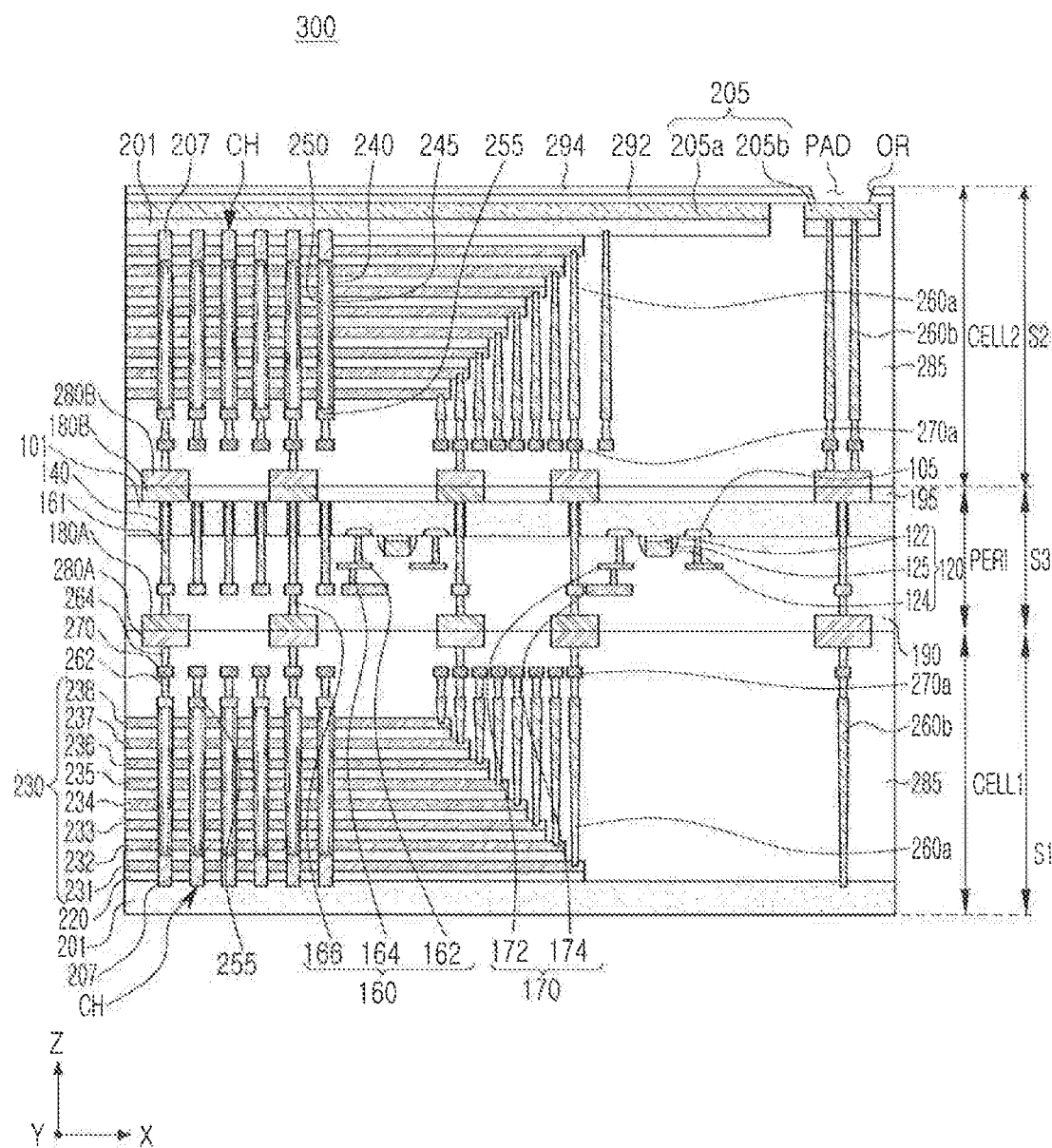
FIG. 11 is a cross-sectional view of a semiconductor device according to an example embodiment of the present inventive concepts.

Referring to the example embodiment shown in FIG. 10, a semiconductor device 200 includes a first substrate structure S1 and a second substrate structure S2, which are vertically stacked. Unlike the example embodiment shown in FIG. 4, the first substrate structure S1 may include both a first memory cell region CELL1 and a peripheral circuit region PERI. The second substrate structure S2 may include a second memory cell region CELL2, as illustrated in FIG. 4. Hereinafter, the same reference numerals as those in FIG. 4 denote the same components, and thus, duplicate explanations will be omitted.

The first substrate structure S1 may have a structure in which the first memory cell region CELL1 is disposed on the peripheral circuit region PERI to be electrically connected to the peripheral circuit region PERI. To achieve the electrical connection, the first substrate structure S1 may further include a through-interconnection insulating layer 282. The through-interconnection insulating layer 282 may be disposed to penetrate gate electrodes 230 and interlayer dielectrics 220. A through-contact plug 261 may be disposed in the through-interconnection insulating layer 282. The through-contact plug 261 may penetrate the through-interconnection insulating layer 282 and may be directly connected to circuit interconnection lines 170 of the peripheral circuit region PERI through the substrate 201. The portion of the through-contact plug 261 that penetrates the through-interconnection insulating layer 282, may be insulated from the substrate 201 by a side insulating layer 283.

The first memory cell region CELL1 may have a structure that is identical or similar to a structure of the second memory cell region CELL2. In example embodiments, the arrangement of an interconnection structure including the first cell contact plugs 260a in the first memory cell region CELL1 may be different from the arrangement thereof in the second memory cell region CELL2. The first memory cell region CELL1 may include first bonding pads 180.

The semiconductor device 200 may have a structure in which bitlines 270 of the first and second memory cell regions CELL1 and CELL2 are electrically connected to each other by an interconnection structure including the first and second bonding pads 180 and 280. Accordingly, vertically disposed channels CH have a structure sharing the bitlines 270. At least some of the gate electrodes 230 in the first and second memory cell regions CELL1 and CELL2 may also be electrically connected to each other by the interconnection structure including the first and second bonding pads 180 and 280. As described above, the semiconductor device 200 may have a bitline sharing structure and a gate electrode connection structure, allowing integration density to be higher.

Referring to the example embodiment shown in FIG. 1, a semiconductor device 300 may include a first substrate structure S1, a third substrate structure S3, and a second substrate structure S2 which are sequentially and vertically stacked. The first substrate structure S1 may include a first memory cell region CELL1. The third substrate structure S3 may include a peripheral circuit region PERI. The second substrate structure S2 may include a second memory cell region CELL2. Hereinafter, explanations duplicated with those in FIGS. 4 and 10 will be omitted.

The peripheral circuit region PERI includes circuit-through contact plugs 161 penetrating a first substrate 101, first and second peripheral region insulating layers 190 and 195, and third and fourth bonding pads 180A and 18B exposed to top and bottom surfaces through the peripheral region insulating layers 190 and 195.

The circuit-through contact plugs 161 may be configured to connect the third and fourth bonding pads 180A and 180B to each other. The circuit-through contact plugs 161 may penetrate portions of the first substrate 101 and the first peripheral region insulating layers 190. The circuit-through contact plugs 161 may be insulated from the first substrate 101 by a substrate insulating layer 140 disposed on a portion of a side surface.

The third and fourth bonding pads 180A and 180B may be respectively disposed on both surfaces of the third substrate structure S3 to be connected to each other through the circuit-through contact plugs 161, and second circuit interconnection lines 174, and the third circuit contact plugs 166. The fourth bonding pads 180B may be disposed to be in contact with a top surface of the first substrate 101. The third bonding pads 180A are bonded to the first bonding pads 280A of the first substrate structure S and the fourth bonding pads 180B are bonded to second bonding pads 280B of the second substrate structure S2, and the fourth bonding pads 180B may be bonded to second bonding pads 280B of the second substrate structure S2. Thus, the third bonding pads 180A may be electrically connected to bitlines 270 of the first substrate structure S1, and the fourth bonding pads 180B may be electrically connected to bitlines of the second substrate structure S2 and first and second cell contact plugs 260a and 260b. As a result, the first to third substrate structures S1, S2, and S3 may be electrically connected to each other through the third and fourth bonding pads 180A and 180B.

FIGS. 12A to 12I are cross-sectional views illustrating a method of fabricating a semiconductor device according to example embodiments of the present inventive concept. FIGS. 12A to 12I illustrate a region corresponding to FIG. 4.

Figure 12A:
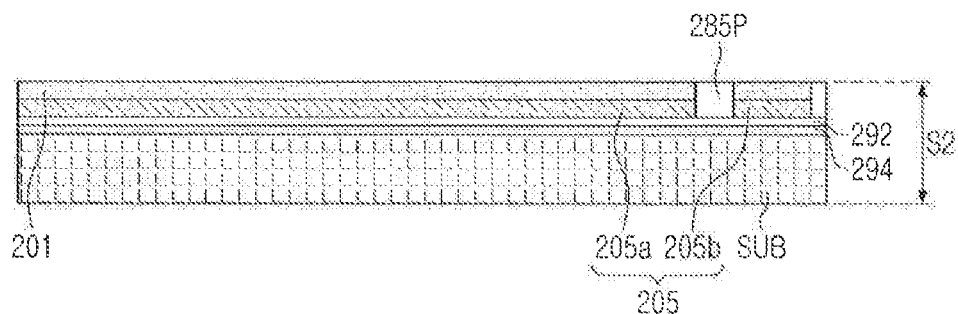
FIGS. 12A to 12I are cross-sectional views illustrating a method of fabricating a semiconductor device according to an example embodiment of the present inventive concepts.

Referring to FIG. 12A, the second substrate structure S2 in FIG. 4 may be formed. To this end, a second pad insulating layer 294, a first pad insulating layer 292, a conductive layer 205, and a second substrate 201 may be sequentially formed on a base substrate SUB to form the second substrate structure S2.

The base substrate SUB is a layer to be removed through a subsequent process, and may be a semiconductor substrate such as a silicon (S1) substrate. In FIG. 4, layers disposed on the second substrate 201 may be formed on the base substrate SUB in a reverse order. If the semiconductor device includes the features of the example embodiment shown in FIG. 9, a top insulating layer 287, first and second top interconnection lines 272 and 276 and top vias 274, disposed in the top insulating layer 287, may be formed between a first pad insulating layer 205 and a first pad insulating layer 292.

After a conductive layer 205 and a second substrate 201 are formed on the entire surface, they may be patterned to be separated from each other by a cell region insulating layer 285P in first and second regions I and II. Accordingly, the conductive layer 205 may include first and second conductive layers 205a and 205b spaced apart from each other. The cell region insulating layer 285P may constitute the cell region insulating layer 285 in FIG. 4 together with an insulating layer formed in a subsequent process. In FIG. 12, the cell region insulating layer 285P is denoted by a reference numeral different from the reference numeral in FIG. 4. If the semiconductor device includes the features of the example embodiments shown in FIGS. 8A and 8B, in this stage, the first and second pad insulating layers 292 and 294 may be patterned to form openings, and the openings may be filled during formation of the conductive layer 205 to form an extension portion 205E.

Figure 12B:
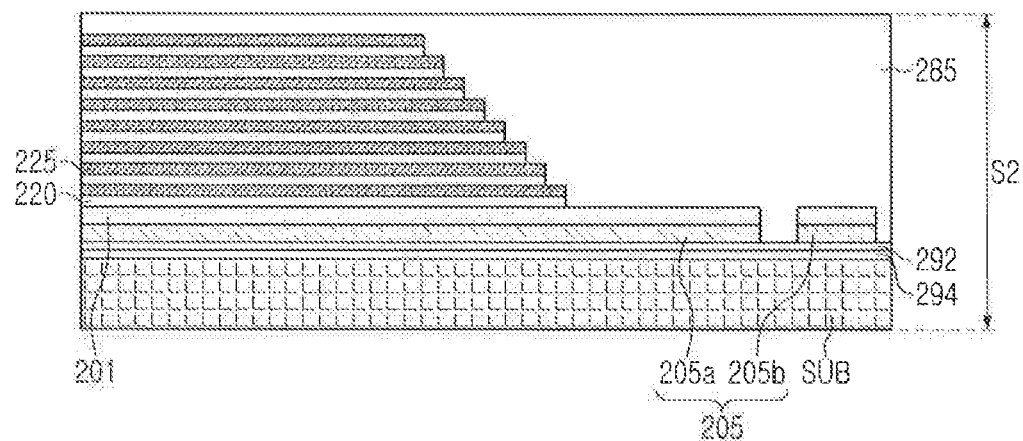

Referring to FIG. 12B, sacrificial layers 225 and interlayer dielectrics 220 are alternately stacked on the second substrate 201. Portions of the sacrificial layers 225 and the interlayer dielectrics 220 may be removed such that the sacrificial layers 225 extend by different lengths to each other.

The sacrificial layers 225 may be layers that are replaced with gate electrodes 230 through a subsequent process. The sacrificial layers 225 may be formed of a material which may be etched with an etch selectivity to the interlayer dielectrics 220. For example, in an example embodiment, the interlayer dielectric 220 may be formed of at least one of a silicon oxide and a silicon nitride, and the sacrificial layers 225 may be formed of one, selected from silicon, a silicon oxide, a silicon carbide, and a silicon nitride, which is different from the material of the interlayer dielectric 220. In example embodiments, some or all of the interlayer dielectric layers 220 may have different thicknesses from each other.

A photolithography process and an etching process may be repeatedly performed on the sacrificial layers 225 and the interlayer dielectrics 220 in such a manner that overlying sacrificial layers 225 are extended to be shorter than underlying sacrificial layers 225. Thus, the sacrificial layers 225 may have a stepwise shape. In example embodiments, each of the sacrificial layers 225 may be formed to have a relatively small thickness at an end portion thereof. An insulating material, covering an upper portion of a stacked structure of the sacrificial layers 225 and the interlayer dielectrics 220, may be deposited to form a cell region insulating layer 285.

Figure 12C:
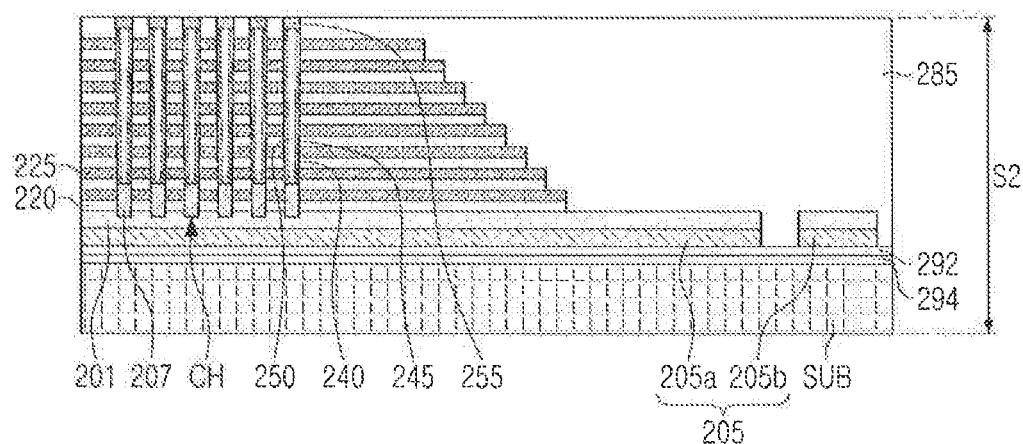

Referring to FIG. 12C, channels CH may be formed to penetrate the stacked structure of the sacrificial layers 225 and the interlayer dielectrics 220.

To form the channels CH, the stacked structure may be anisotropically etched to form channel holes. Due to a height of the stacked structure, sidewalls of the channel holes may not be perpendicular to a top surface of a second substrate 201. In example embodiments, the channel holes may be formed to recess a portion of the second substrate 201. However, the channel holes may not be formed to extend to the conductive layer 205.

An epitaxial layer 207, a channel region 240, a gate dielectric layer 245, a channel insulation layer 250, and channel pads 255 may be formed in the channel holes to form the channels CH. The epitaxial layer 207 may be formed using selective epitaxial growth (SEG). The epitaxial layer 207 may include a single layer or multiple layers. In example embodiments the epitaxial layer 207 may include doped or undoped polysilicon, monocrystalline silicon, polycrystalline germanium, or monocrystalline germanium. The gate dielectric layer 245 may be formed to have a uniform thickness using atomic layer deposition (ALD) or chemical vapor deposition (CVD). In this stage, at least a portion of the gate dielectric layer 245, vertically extending along the channel region 240, may be formed. The channel region 240 may be formed on the gate dielectric layer 245 in the channels CH. The channel insulating layer 250 is formed to fill the channels CH and may include an insulating material. In example embodiments, a space between the channel regions 240 may be filled with a conductive material rather than the channel insulating layer 250. The channel pads 255 may be formed of a conductive material, for example, polysilicon.

Figure 12D:
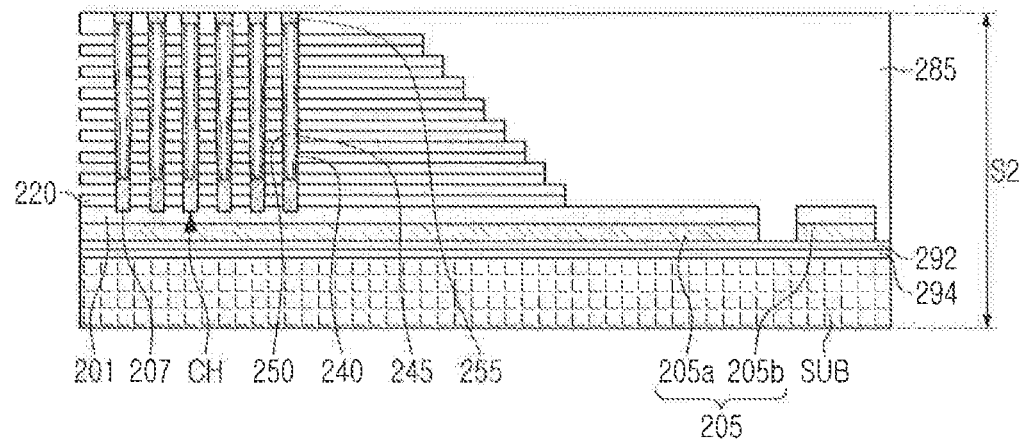

Referring to FIG. 12D, openings may be formed to penetrate the stacked structure of the sacrificial layers 225 and the interlayer dielectrics 220, and the sacrificial layers 225 may be removed through the openings.

Each of the openings may be formed in the form of a trench extending in the X direction in a region. The sacrificial layers 225 may be selectively removed with respect to the interlayer dielectric 220 using, for example, wet etching. Accordingly, portions of sidewalls of the channels CH may be exposed between the interlayer dielectrics 220.

Figure 12E:
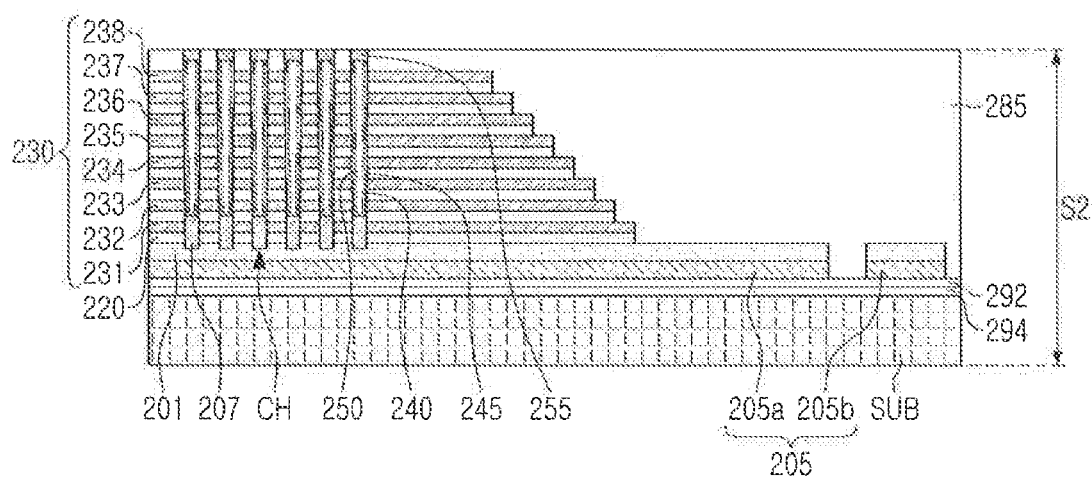

Referring to FIG. 12E, the gate electrodes 230 may be formed in a region in which the sacrificial layers 225 are removed.

The gate electrodes 230 may be formed by filling the region, in which the sacrificial layers 225 are removed with a conductive material. The gate electrodes 230 may include a metal, polysilicon, or a metal silicide material. In example embodiments, in the case in which there is a region horizontally extending onto the second substrate 201 along the gate electrodes 230 of the gate dielectric layer 245, the region may be formed prior to formation of the gate electrodes 230. An insulating material may fill the openings in a region, not illustrated.

Figure 12F:
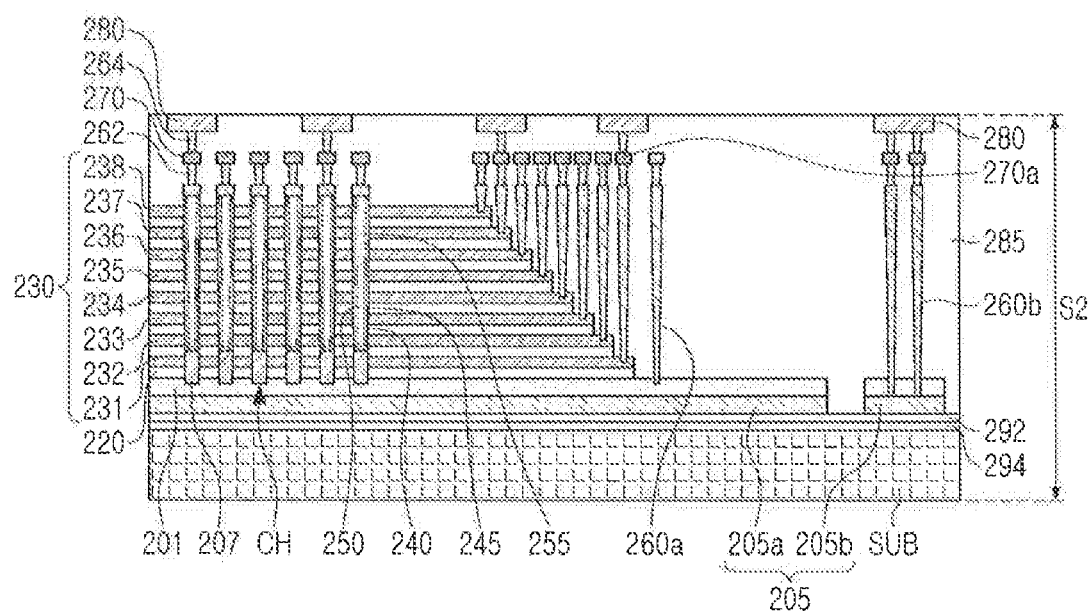

Referring to FIG. 12F, first and second cell contact plugs 260*a* and 260*b*, first conductive plugs 262, bitlines 270 and 270*a*, second conductive plugs 264, and second bonding pads 280 may be formed on the gate electrodes 230 as interconnection structures.

The first and second cell contact plugs 260*a* and 260*b* are formed by etching the cell region insulating layer 285 on the gate electrodes 230 and the second substrate 201 to form contact holes and filling the contact holes with a conductive material. The first conductive plugs 262 may be formed by etching the cell region insulating layer 285 on the channel pads 255 and the first and second cell contact plugs 260*a* and 260*b* and depositing a conductive material.

The bitlines 270 and 270*a* may be formed through deposition and patterning processes of a conductive material. Alternatively, the bitlines 270 and 270*a* may be formed by forming a single insulating layer constituting the cell region insulating layer 285, patterning the single insulating layer, and depositing a conductive material. The second conductive plugs 264 may be formed by etching the cell region insulating layer 285 on the bitlines 270 and 270*a* and depositing a conductive material.

The second bonding pads 280 may be formed on the second conductive plugs 264 through, for example, deposition and patterning processes of a conductive material. The second bonding pads 280 may have top surfaces, exposed through the cell region insulating layer 285, and may constitute a portion of the top surface of the second substrate structure S2. The top surfaces of the second bonding pads 280 may be formed to protrude more upwardly than the top surface of the cell region insulating layer 285. Ultimately, a second substrate structure S2 may be prepared by this stage.

Figure 12G:
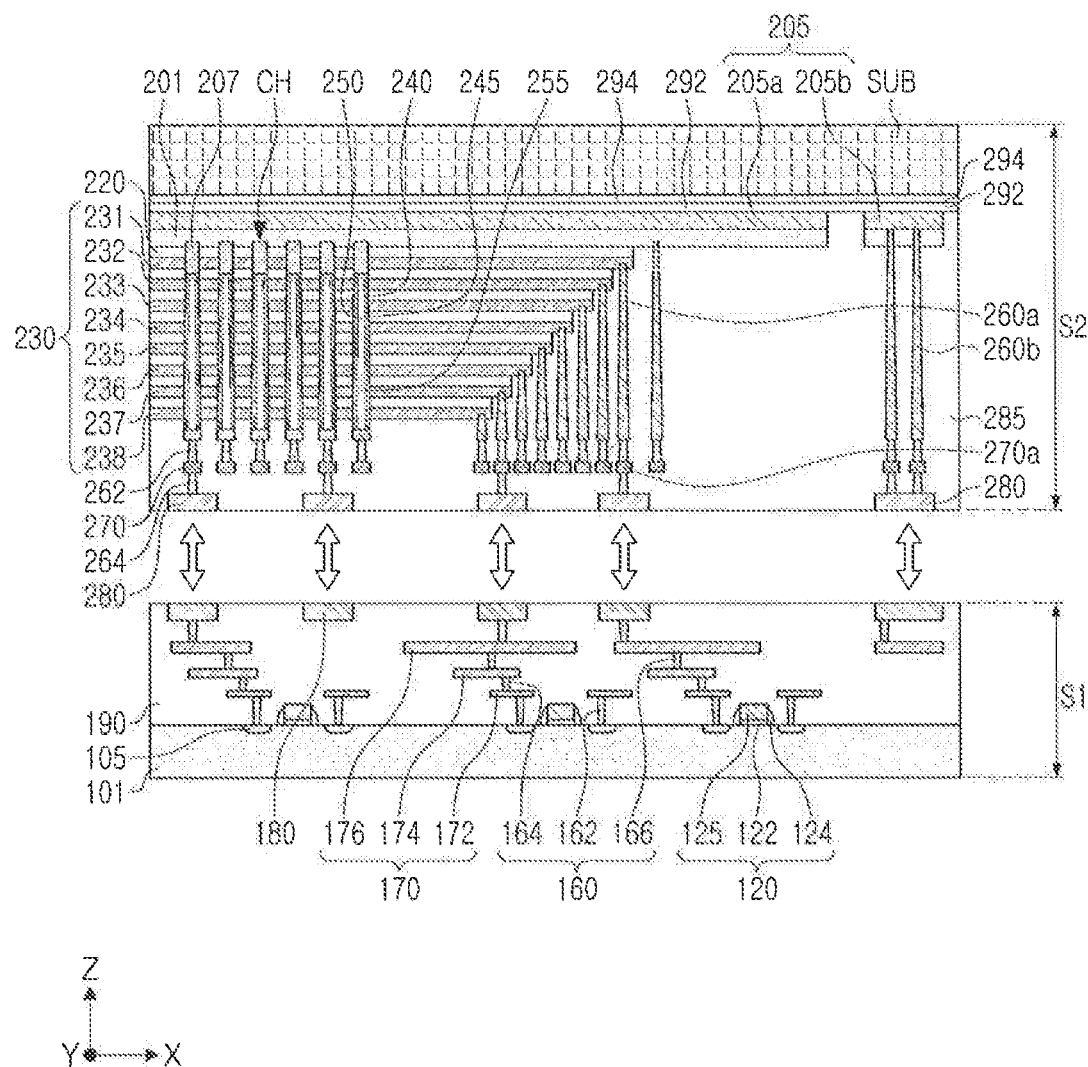
Figure 12H:
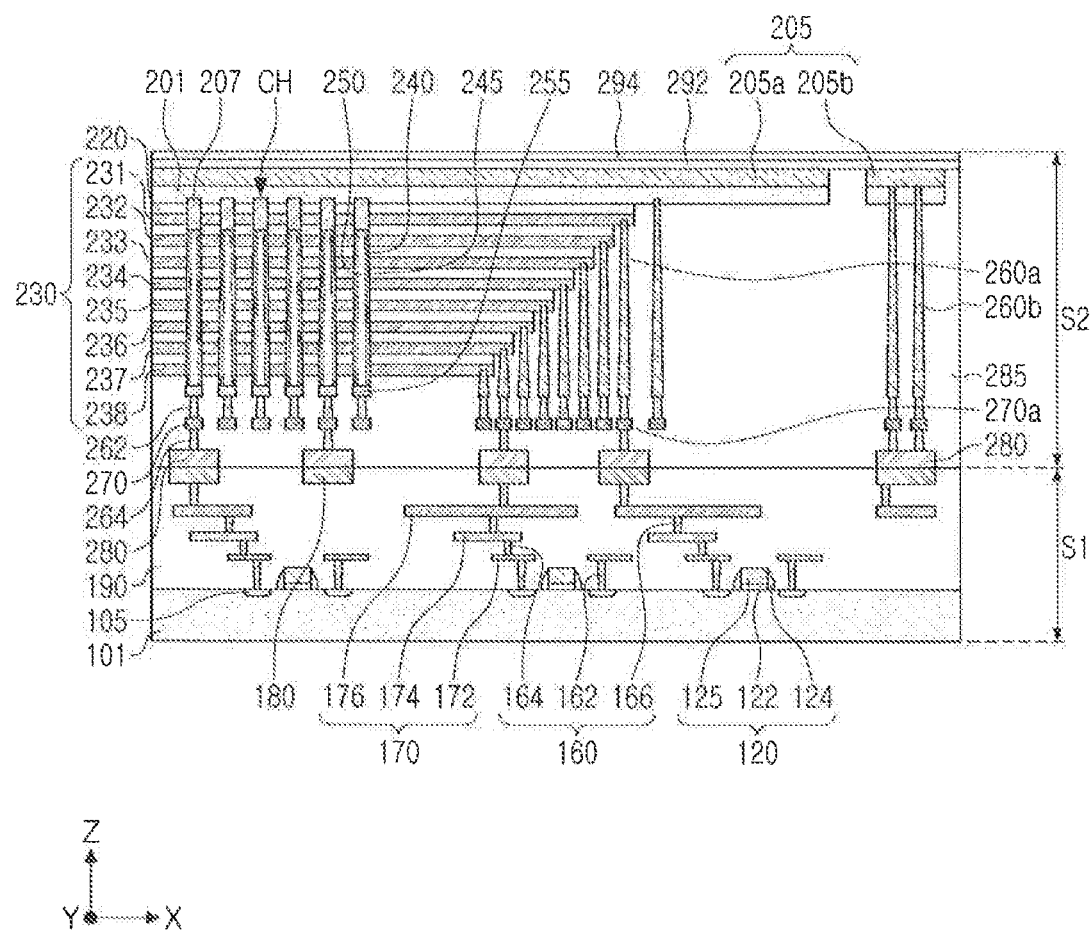

Referring to FIG. 12G, the second substrate structure S2 may be bonded onto the first substrate structure S1.

The first substrate structure S2 may be prepared by forming circuit elements 120 and circuit interconnection structures on the first substrate 101.

A circuit gate dielectric layer 122 and a circuit gate electrode 125 may be sequentially formed on the first substrate 101. The circuit gate dielectric layer 122 and the circuit gate electrode 125 may be formed using ALD or CVD. The circuit gate dielectric layer 122 is formed of a silicon oxide, and the circuit gate electrode 125 may be formed of at least one of polysilicon or a metal silicide, but the materials thereof are not limited thereto. A spacer layer 124 and source/drain regions 105 may be formed on both sidewalls of the circuit gate dielectric layer 122 and the circuit gate electrode 125. In example embodiments, the spacer layer 124 may include a plurality of layers. An ion implantation process may be performed to form the source/drain regions 105.

The circuit contact plugs 160 of the circuit interconnection structures may be formed by forming a portion of the peripheral region insulating layer 190, etching and removing the portion of the peripheral region insulating layer 190, and filling with a conductive material. In one example embodiment, the circuit interconnection lines 170 may be formed by depositing a conductive material and patterning the deposited conductive material.

The peripheral region insulating layer 190 may include a plurality of insulating layers. A portion of the peripheral region insulating layer 190 may be formed in respective steps of forming the circuit interconnection structures, and another portion thereof may be formed on the third circuit interconnection line 176. Ultimately, the peripheral circuit insulating layer may be formed to cover the circuit elements 120 and the circuit interconnection structures.

The first substrate structure S1 and the second substrate structure S2 may be connected to each other by pressing and bonding the first bonding pads 180 and the second bonding pads 280. By turning over the second substrate structure S2 on the first substrate structure S1, the second bonding pads 280 may be bonded downwardly. For better understanding, in this drawing, the second substrate structure S2 is depicted as being bonded in the form of a mirror image of the structure illustrated in FIG. 12F. The first substrate structure S1 and the second substrate structure S2 may be directly bonded without interposing an adhesive, such as a separate adhesive layer, therebetween. For example, the first bonding pads 180 and the second bonding pads 280 may form bonding at an atomic level by the pressing process. In example embodiments, before bonding, a surface treatment process such as a hydrogen plasma treatment may be further performed on a top surface of the first substrate structure S1 and a bottom surface of the second substrate structure S2 to enhance bonding force.

In example embodiments, in the case in which the cell region insulating layer 285 includes the above-described bonding dielectric layer thereon and the first substrate structure S1 has the same layer, the bonding strength may be further secured by bonding between the first and second bonding pads 180 and 280 as well as dielectric bonding between the bonding dielectric layers.

From a top surface of the base substrate SUB, a portion of the base substrate SUB may be removed by a polishing process such as a grinding process, and the other portion thereof may be removed by an etching process such as a wet etching process. Accordingly, the second pad insulating layer 294 may be exposed upwardly. During the wet etching process, the first and second pad insulating layers 292 and 294 may be used as an etch stop layer. Thus, the first and second pad insulating layers 292 and 294 may include a material different from a material of the base substrate SUB. A material, which is capable of having etch selectivity under specific etching conditions, may be selected as the material of the first and second pad insulating layers 292 and 294. The base substrate SUB of the second substrate structure S2 may be removed to significantly reduce the total thickness of the semiconductor device.

Figure 12I:
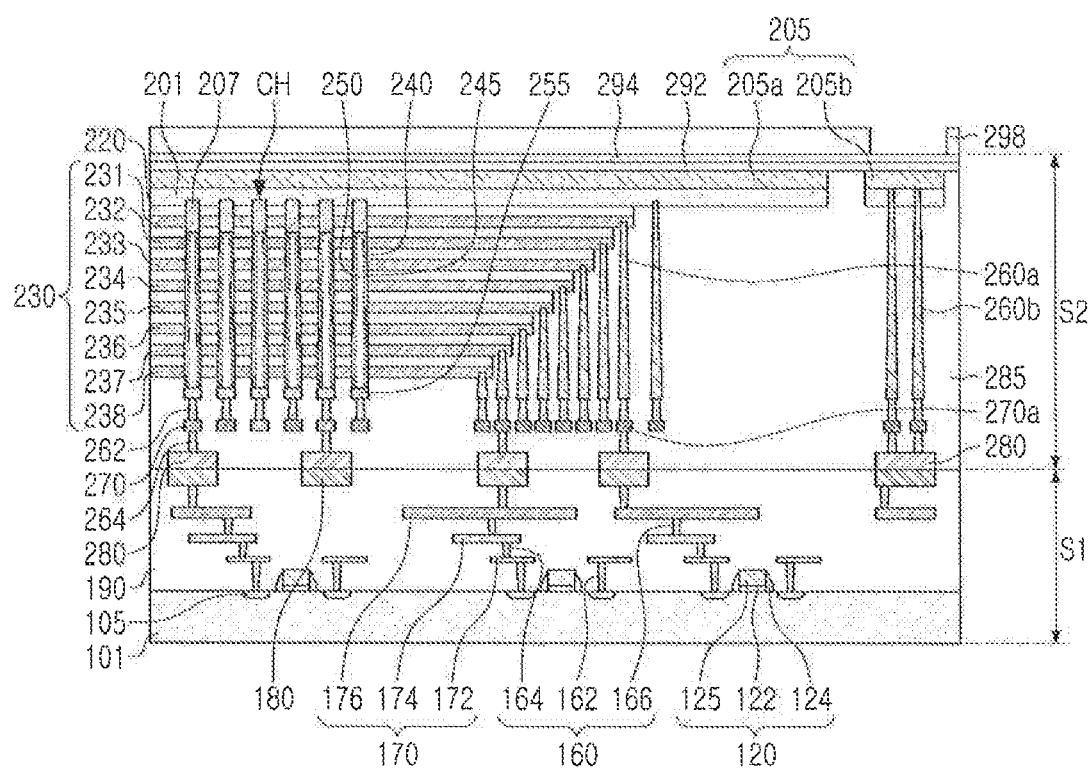

Referring to FIG. 12I, a patterned passivation layer 298 may be formed on the first and second pad insulating layers 292 and 294.

In this stage, the passivation layer 298 may be used as a mask layer and may be, for example, a photoresist resin layer. The passivation layer 298 may be patterned to expose the pad region PAD in FIG. 4 by a photolithography process.

The first and second pad insulating layers 292 and 294 exposed from the passivation layer 298 may be removed to form an opening OR, as illustrated in FIG. 4. Thus, an underlying second conductive layer 205*b* may be exposed upwardly in the pad region PAD. When the first and second pad insulating layers 292 and 294 are removed, the second conductive layer 205*b* may be used as an etch stop layer to easily perform an etching process. Ultimately, the semiconductor device 100 of FIG. 4 may be fabricated. The passivation layer 298 may be removed or used as a protective layer without being removed, as described in the example embodiment shown in FIG. 7. In the case of the example embodiment shown in FIGS. 6A, 6B and 8B, a semiconductor device may be fabricated by forming connection layers 295 and 295*a* on the exposed second conductive layer 205*b*.

Figure 13:
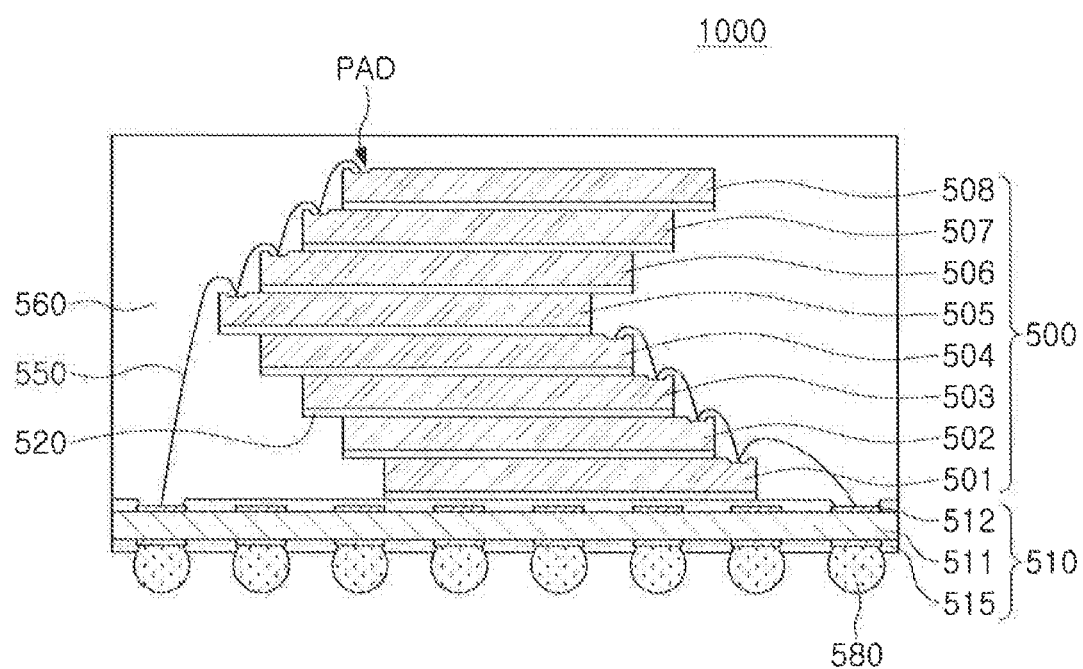
FIG. 13 is a cross-sectional view of a semiconductor device according to an example embodiment of the present inventive concepts.

Referring to the example embodiment shown in FIG. 13, a semiconductor package 1000 includes a package substrate 510, memory chips 500 (501 to 508) stacked on the package substrate 510, an adhesive layer 520 attaching the memory chips, wires 550 connected between the memory chips 500 and the package substrate 510, an encapsulation portion 560 encapsulating the memory chips 500, and connection terminals disposed on a bottom surface of the package substrate 510.

The package substrate 510 includes a body portion 511, conductive substrate pads 512 disposed on top and bottom surfaces of the body portion 511, and an insulating passivation layer 515 covering the substrate pads 512. The body portion 511 may include, for example, silicon (S1), a glass, a ceramic, or a plastic. The body portion 511 may be a single layer or may have a multilayer structure including interconnection patterns therein.

The memory chips 500 may be stacked on the package substrate 510 and underlying memory chips 500 using the adhesive layer 520. The memory chips 500 may include the semiconductor devices 100, 100a. 100b, 100c, 100d, 100e, 100f, 200, 300 described above with reference to FIGS. 4 to 10. The memory chips 500 may include the same type of memory chip or different types of memory chip. In the case in which the memory chips 500 include different types of memory chip, the memory chip may include a DRAM, an SRAM, a PRAM, an ReRAM, an FeRAM, or an MRAM in addition to the above-described semiconductor devices 100, 100a, 100b, 100c, 100d, 100e, 100f, 200, and 300 described. The memory chips 500 may have the same size or different sizes, and the number of the memory chips 500 is not limited to that illustratively shown in the drawing. The memory chips 500 may be disposed on a top surface of a pad region PAD. The pad region PAD may be disposed adjacent to edges of the memory chips 500. However, dispositions of the pad region PAD are not limited thereto. For example, when a signal transmission medium corresponding to the wires 550 is formed using 3D printing, the pad region PAD may not be disposed at the edges of the memory chips. The memory chips 500 may be sequentially offset and stacked in such a manner that the pad region PAD is exposed.

The wires 550 may electrically connect overlying memory chips 500 and underlying memory chips 500 to each other or may connect at least some of the memory chips 500 to substrate pads 512 of the package substrate 510. However, since the wires 550 are an example of a signal transmission structure, they may be changed to various types of signal transmission medium according to example embodiments.

The encapsulation portion 560 may be disposed to cover the memory chips 500, the wires 550, and a top surface of the package substrate 510, and may serve to protect the memory chips 500. The encapsulation portion 560 may be formed of, for example, a silicone-based material, a thermosetting material, a thermoplastic material, an ultraviolet (UV) curing material, or the like. The encapsulation portion 560 may be formed of a polymer such as a resin. In an example embodiment, the encapsulation portion may be formed of an epoxy molding compound (EMC).

The connection terminals 580 may be configured to connect the semiconductor package 1000 to a mainboard or the like of an electronic device on which the semiconductor package 1000 is mounted. The connection terminals 580 may include at least one of conductive materials such as a solder, tin (Sn), silver (Ag), copper (Cu), and aluminum (Al). In example embodiments, the connection terminals 580 may be changed to various forms such as a land, a ball, a pin, and the like.

As described above, in a structure in which two or more substrate structures are bonded to each other, an input/output pad may be disposed using a source conductive layer. Thus, a semiconductor device having improved integration density and reliability may be provided.

While example embodiments have been shown and described above, it will be apparent to those skilled in the art that modifications and variations could be made without departing from the scope of the present inventive concept as defined by the appended claims.

What is claimed is:

1. A semiconductor device comprising:
a first substrate structure including a first substrate, circuit elements disposed on the first substrate, and first bonding pads disposed on the circuit elements; and
a second substrate structure connected to the first substrate structure, the second substrate structure including:
a second substrate having first and second surfaces disposed to oppose each other,
first and second conductive layers disposed on the first surface of the second substrate and spaced apart from each other,
a pad insulating layer disposed on the first and second conductive layers and having an opening exposing a portion of the second conductive layer,
gate electrodes stacked to be spaced apart from each other on the second surface of the second substrate in a first direction, perpendicular to the second surface, the gate electrodes being configured to extend by different lengths in a second direction, parallel to the second surface, and being configured to electrically connected to the circuit elements,
first contact plugs extending on the second surface of the second substrate in the first direction and connected to the gate electrodes,
a second contact plug extending on the second surface of the second substrate in the first direction and electrically connected to the second conductive layer, and
second bonding pads electrically connected to the first contact plugs and second contact plug and disposed on the first contact plugs and second contact plug to correspond to the first bonding pads.

2. The semiconductor device of claim 1, wherein the first conductive layer is disposed to overlap the gate electrodes, and the second conductive layer is horizontally spaced apart from the gate electrodes and does not overlap the gate electrodes.

3. The semiconductor device of claim 1, wherein the second substrate structure includes a plurality of second contact plugs, and the plurality of second contact plugs are connected to the second conductive layer.

4. The semiconductor device of claim 1, wherein the second contact plug is directly connected to the second conductive layer through the second substrate.

5. The semiconductor device of claim 1, wherein:
the pad insulating layer has a side surface defining the opening;
the second conductive layer has a top surface exposed by the opening; and
the side surface of the pad insulating layer and the top surface of the second conductive layer are exposed outwardly of the semiconductor device.

6. The semiconductor device of claim 1, wherein the second substrate structure further includes a connection layer, disposed on the second conductive layer exposed by the opening of the pad insulating layer, and the connection layer includes a material that is different from a material of the second conductive layer.

7. The semiconductor device of claim 1, wherein the second conductive layer has an extension portion that is configured to extend into the opening of the pad insulating layer to fill the opening.

8. The semiconductor device of claim 7, wherein the second conductive layer has a bottom surface that includes a concave portion in a region corresponding to the extension portion.

9. The semiconductor device of claim 1, wherein the pad insulating layer includes first and second pad insulating layers stacked vertically, wherein the first and second pad insulating layers include different materials from each other.

10. The semiconductor device of claim 1, further comprising:
a passivation layer disposed on the pad insulating layer, and being configured to extend the opening of the pad insulating layer, the passivation layer being formed of a photoresist material.

11. The semiconductor device of claim 1, wherein the pad insulating layer includes a plurality of openings and the second substrate structure includes a plurality of second conductive layers, and
the plurality of second conductive layers are disposed along an edge of the semiconductor device on a plane when viewed from above.

12. The semiconductor device of claim 1, wherein the first and second conductive layers are disposed at substantially the same height level and have substantially the same thickness.

13. The semiconductor device of claim 1, wherein the second substrate structure further includes at least one conductive plug and at least one interconnection line disposed between the respective first and second conductive plugs and the second bonding pads.

14. The semiconductor device of claim 13, wherein the first contact plugs and second contact plug have substantially a same width at a height level at which each of the first contact plugs and second contact plug is connected to the conductive plug.

15. The semiconductor device of claim 1, wherein the second substrate structure further includes channels penetrating the gate electrodes and vertically extending on the second substrate, and
each of the channels has an end portion disposed on a bottom surface of the second substrate or in the second substrate.

16. A semiconductor device comprising:
a first substrate structure including a first substrate, circuit elements disposed on the first substrate, and first bonding pads disposed on the circuit elements; and
a second substrate structure connected to the first substrate structure, the second substrate structure including:
a second substrate;
gate electrodes stacked to be spaced apart from each other on a bottom surface of the second substrate in a first direction that is perpendicular to the bottom surface of the second substrate, and extending by different lengths in a second direction that is parallel to the bottom surface of the second substrate, the gate electrodes being electrically connected to the circuit elements;
a first conductive layer disposed on the second substrate above the gate electrodes;
a second conductive layer spaced apart from the first conductive layer horizontally at the same height level as the first conductive layer;
a pad insulating layer disposed on the first and second conductive layers and having an opening exposing portions of the second conductive layer;
first contact plugs extending on the bottom surface of the second substrate in the first direction and connected to the gate electrodes and the second substrate, respectively; and
second bonding pads electrically connected to the first contact plugs and disposed on the first contact plugs to correspond to the first bonding pads,
wherein an electrical signal is applied to the first conductive layer through the first contact plug and the second substrate.

17. The semiconductor device of claim 16, wherein the second substrate structure has a recessed region at an upper end of the second substrate structure along the opening of the pad insulating layer.

18. The semiconductor device of claim 16, wherein the second substrate structure further includes a second contact plug extending on the bottom surface of the second substrate in the first direction and electrically connected to the second conductive layer.

19. A semiconductor device comprising:
a first substrate structure including a first substrate, semiconductor elements disposed on the first substrate, and first bonding pads disposed on the semiconductor elements; and
a second substrate structure connected to the first substrate structure, the second substrate structure including a second substrate, gate electrodes stacked to be spaced apart from each other on a bottom surface of the second substrate in a direction perpendicular to the bottom surface of the second substrate and electrically connected to the semiconductor elements, a first conductive layer disposed on the second substrate above the gate electrodes, a second conductive layer spaced apart from the first conductive layer horizontally and electrically connected to an external device, a pad insulating layer disposed on the first and second conductive layers, first contact plugs extending on the bottom surface of the second substrate in the direction perpendicular to the bottom surface of the second substrate and connected to the gate electrodes and the second substrate, respectively, a second contact plug extending on the bottom surface of the second substrate in the direction perpendicular to the bottom surface of the second substrate and electrically connected to the second conductive layer, and second bonding pads electrically connected to the first and second contact plugs, respectively and disposed on the first and second contact plugs to correspond to the first bonding pads.

20. The semiconductor device of claim 19, wherein the second substrate structure further includes a top interconnection line and a top via disposed on the first and second conductive layers to be electrically connected to the second conductive layer, and
the pad insulating layer is disposed on the top interconnection line and has an opening exposing a portion of the top interconnection line.

* * * * *